US012349457B2

(12) United States Patent
Cheng et al.

(10) Patent No.: US 12,349,457 B2
(45) Date of Patent: Jul. 1, 2025

(54) STACKED TRANSISTORS HAVING BOTTOM CONTACT WITH REPLACEMENT SPACER

(71) Applicant: INTERNATIONAL BUSINESS MACHINES CORPORATION, Armonk, NY (US)

(72) Inventors: Kangguo Cheng, Schenectady, NY (US); Ruilong Xie, Niskayuna, NY (US); Julien Frougier, Albany, NY (US); Heng Wu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 547 days.

(21) Appl. No.: 17/659,197

(22) Filed: Apr. 14, 2022

(65) Prior Publication Data
US 2023/0335554 A1 Oct. 19, 2023

(51) Int. Cl.
*H10D 84/85* (2025.01)
*H10D 30/01* (2025.01)
*H10D 30/67* (2025.01)
*H10D 62/10* (2025.01)
*H10D 64/01* (2025.01)
*H10D 84/01* (2025.01)
*H10D 84/03* (2025.01)
(Continued)

(52) U.S. Cl.
CPC ......... *H10D 84/856* (2025.01); *H10D 30/014* (2025.01); *H10D 30/6713* (2025.01); *H10D 30/6729* (2025.01); *H10D 30/6735* (2025.01); *H10D 30/6757* (2025.01); *H10D 62/118* (2025.01); *H10D 64/015* (2025.01); *H10D 64/021* (2025.01); *H10D 84/0149* (2025.01); *H10D 84/038* (2025.01); *H10D 84/83* (2025.01); *H10D 88/01* (2025.01); *B82Y 10/00* (2013.01); *H10D 30/43* (2025.01); *H10D 62/121* (2025.01); *H10D 64/017* (2025.01); *H10D 64/251* (2025.01); *H10D 84/0128* (2025.01); *H10D 84/0186* (2025.01)

(58) Field of Classification Search
CPC ......... H01L 29/42392; H01L 29/78696; H01L 29/66439; H01L 29/6653; H01L 29/6656; H10D 84/856; H10D 30/014; H10D 30/6713; H10D 30/6729; H10D 30/6757; H10D 62/118; H10D 64/015; H10D 64/021; H10D 84/038; H10D 88/01
See application file for complete search history.

(56) References Cited

U.S. PATENT DOCUMENTS 9,362,355 B1 * 6/2016 Cheng ................. H01L 29/4991
9,659,963 B2 5/2017 Cheng
(Continued)

FOREIGN PATENT DOCUMENTS

WO 2015054928 A1 4/2015

*Primary Examiner* — Britt D Hanley
*Assistant Examiner* — Victor V Barzykin
(74) *Attorney, Agent, or Firm* — L. Jeffrey Kelly

(57) ABSTRACT

A stacked transistor structure including a top source drain region above a bottom source drain region, wherein a width of the bottom source drain region is greater than a width of the top source drain region, a bottom contact structure directly above and in electrical contact with the bottom source drain region, a replacement spacer surrounding the bottom contact structure, and a top gate spacer separating the replacement spacer from a gate conductor.

20 Claims, 25 Drawing Sheets

(51) Int. Cl.
  *H10D 84/83*   (2025.01)
  *H10D 88/00*   (2025.01)
  *B82Y 10/00*   (2011.01)
  *H10D 30/43*   (2025.01)
  *H10D 64/23*   (2025.01)

(56) References Cited

U.S. PATENT DOCUMENTS

| | | | |
|---|---|---|---|
| 9,837,414 B1 | 12/2017 | Balakrishnan | |
| 10,014,215 B2 | 7/2018 | Labonte | |
| 10,074,564 B2 | 9/2018 | Chanemougame | |
| 10,163,727 B2 | 12/2018 | Wang | |
| 10,170,616 B2 | 1/2019 | Xie | |
| 10,192,867 B1 | 1/2019 | Frougier | |
| 10,453,850 B2 | 10/2019 | Smith | |
| 10,879,308 B1 * | 12/2020 | Ando | H10B 63/845 |
| 2009/0159936 A1 | 6/2009 | Shah | |
| 2020/0403034 A1 * | 12/2020 | Ando | H10N 70/011 |
| 2022/0109046 A1 * | 4/2022 | Hong | H01L 27/092 |

\* cited by examiner

SECTION X₁-X₁

SECTION X₂-X₂

SECTION Y₁-Y₁

SECTION Y₂-Y₂

SECTION X₁-X₁

SECTION $X_2$-$X_2$

SECTION Y₁-Y₁

SECTION Y₂-Y₂

SECTION X₁-X₁

SECTION X₂-X₂

SECTION $Y_1$-$Y_1$

SECTION Y₂-Y₂

SECTION X₁-X₁

SECTION $X_2$-$X_2$

SECTION Y₁-Y₁

SECTION Y₂-Y₂

SECTION X₁-X₁

SECTION X₂-X₂

*SECTION Y$_1$-Y$_1$*

*SECTION $Y_2$-$Y_2$*

STACKED TRANSISTORS HAVING BOTTOM CONTACT WITH REPLACEMENT SPACER

BACKGROUND

The present invention generally relates to semiconductor structures, and more particularly to stacked transistor structures having bottom contact with replacement spacer.

Integrated circuit (IC) chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. However, chipmakers face a myriad of challenges at 5 nm, 3 nm and beyond. Currently, traditional chip scaling continues to slow as process complexities and costs escalate at each node.

A potential solution to this chip scaling problem is gate-all-around technology. One example of a complex gate-all-around technology is a complementary FET (CFET) where nFET and pFET nanowires/nanosheets are vertically stacked on top of each other.

SUMMARY

According to an embodiment of the present invention, a semiconductor structure is provided. The semiconductor structure may include a top source drain region above a bottom source drain region, wherein a width of the bottom source drain region is greater than a width of the top source drain region, a bottom contact structure directly above and in electrical contact with the bottom source drain region, a replacement spacer surrounding the bottom contact structure, and a top gate spacer separating the replacement spacer from a gate conductor.

According to another embodiment of the present invention, a semiconductor structure is provided. The semiconductor structure may include a top source drain region above a bottom source drain region, wherein a width of the bottom source drain region is greater than a width of the top source drain region, a bottom contact structure directly above and in electrical contact with the bottom source drain region, a replacement spacer surrounding the bottom contact structure, and a top gate spacer separating the replacement spacer from a gate conductor, wherein the replacement spacer is made from a different material than the top gate spacer.

According to another embodiment of the present invention, a semiconductor structure is provided. The semiconductor structure may include a top stack of nanosheet channels above a bottom stack of nanosheet channels, wherein a width of the bottom stack of nanosheet channels is greater than a width of the top stack of nanosheet channels, a top source drain region above a bottom source drain region, wherein a width of the bottom source drain region is greater than a width of the top source drain region, a bottom contact structure directly above and in electrical contact with the bottom source drain region, a replacement spacer surrounding all sides of the bottom contact structure, and a top gate spacer separating the replacement spacer from a gate conductor.

BRIEF DESCRIPTION OF THE DRAWINGS

The following detailed description, given by way of example and not intended to limit the invention solely thereto, will best be appreciated in conjunction with the accompanying drawings, in which.

Figure 1:
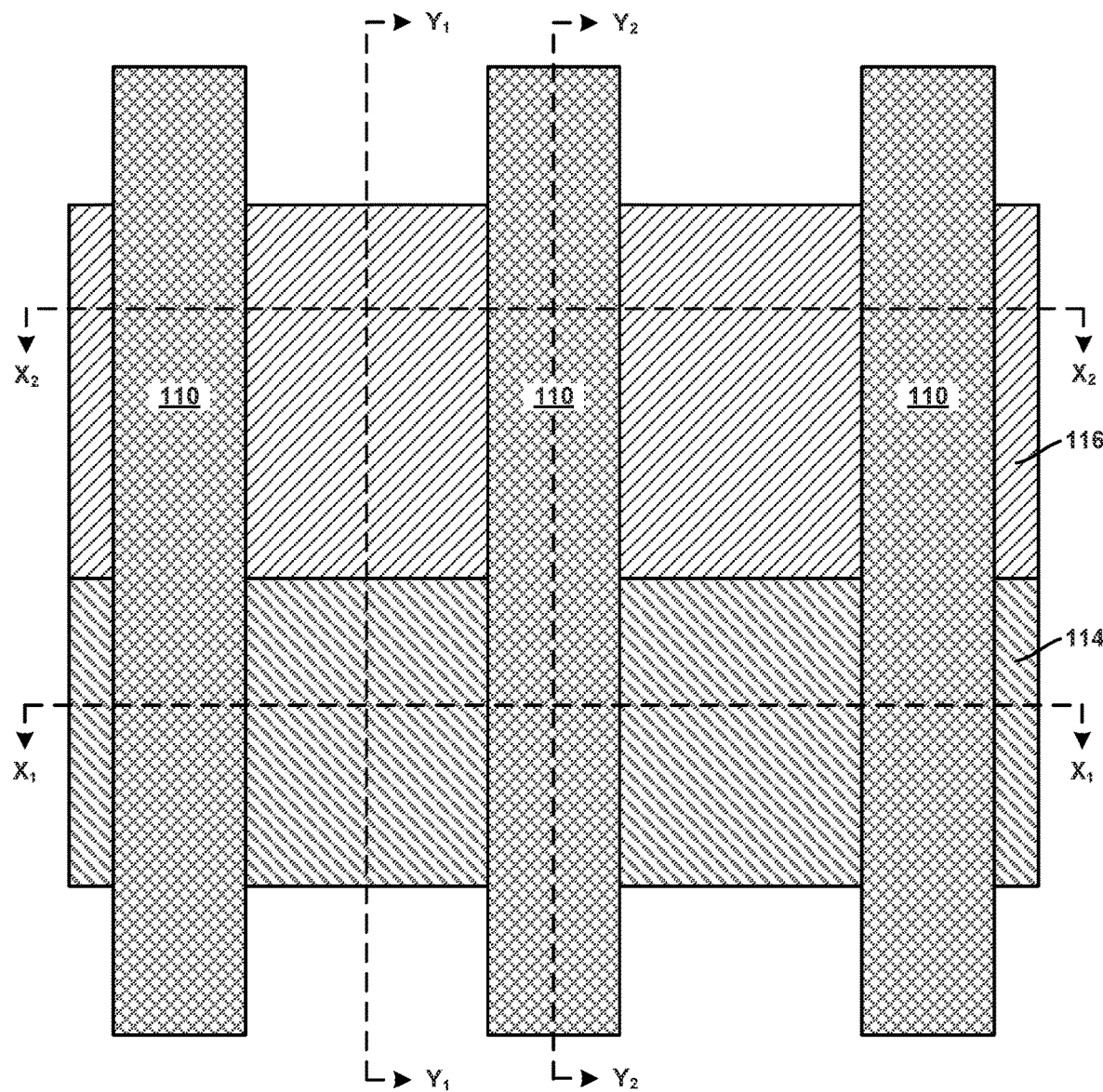
FIG. 1 is a representative illustration of a top view of a structure shown during an intermediate step of a method of fabricating a stacked transistor structure according to an embodiment of the invention.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

Additionally, XYZ Cartesian coordinates may be also shown in each of the drawings to provide additional spatial context. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Complementary field effect transistors, or stacked transistors, have known advantages over conventional transistor structures in terms of density, performance, power consumption, and integration. However, fabricating a bottom contact for a bottom device of a stacked transistor has become increasingly difficult as device spacing continues to shrink with the advent of smaller technology nodes. More specifically, for example, it is particularly challenging to form the bottom contact in small pitch devices without risk of shorting to the top source drain region. One solution includes increasing the lateral size of the bottom contact but doing so conflicts with device scaling and modern pitch requirements. Another solution includes decreasing the lateral size of the top contact; however, doing so directly affect the physical size of other top device components and could negatively affect device performance. Yet another solution includes trimming the top source drain region to make room for a bottom contact; however, the process margin is very small in tight pitch devices and the risk for shorting remains due to misalignment or insulator failure. For purposes of this description, and all embodiments described herein, typical device pitch ranges from approximately 40 nm to approximately 60 nm.

The present invention generally relates to semiconductor structures, and more particularly to stacked transistor structures having bottom contact with replacement spacer. More specifically, the stacked transistor structures and associated method disclosed herein enables a novel solution for providing an electrical contact to the bottom transistor with a replacement spacer to prevent shorting to the gate or the source drain of the top transistor. Exemplary embodiments of stacked transistors having bottom contact with replacement spacer are described in detail below by referring to the accompanying drawings in FIGS. 1 to 25. Those skilled in the art will readily appreciate that the detailed description given herein with respect to these figures is for explanatory purposes as the invention extends beyond these limited embodiments.

Figure 2:
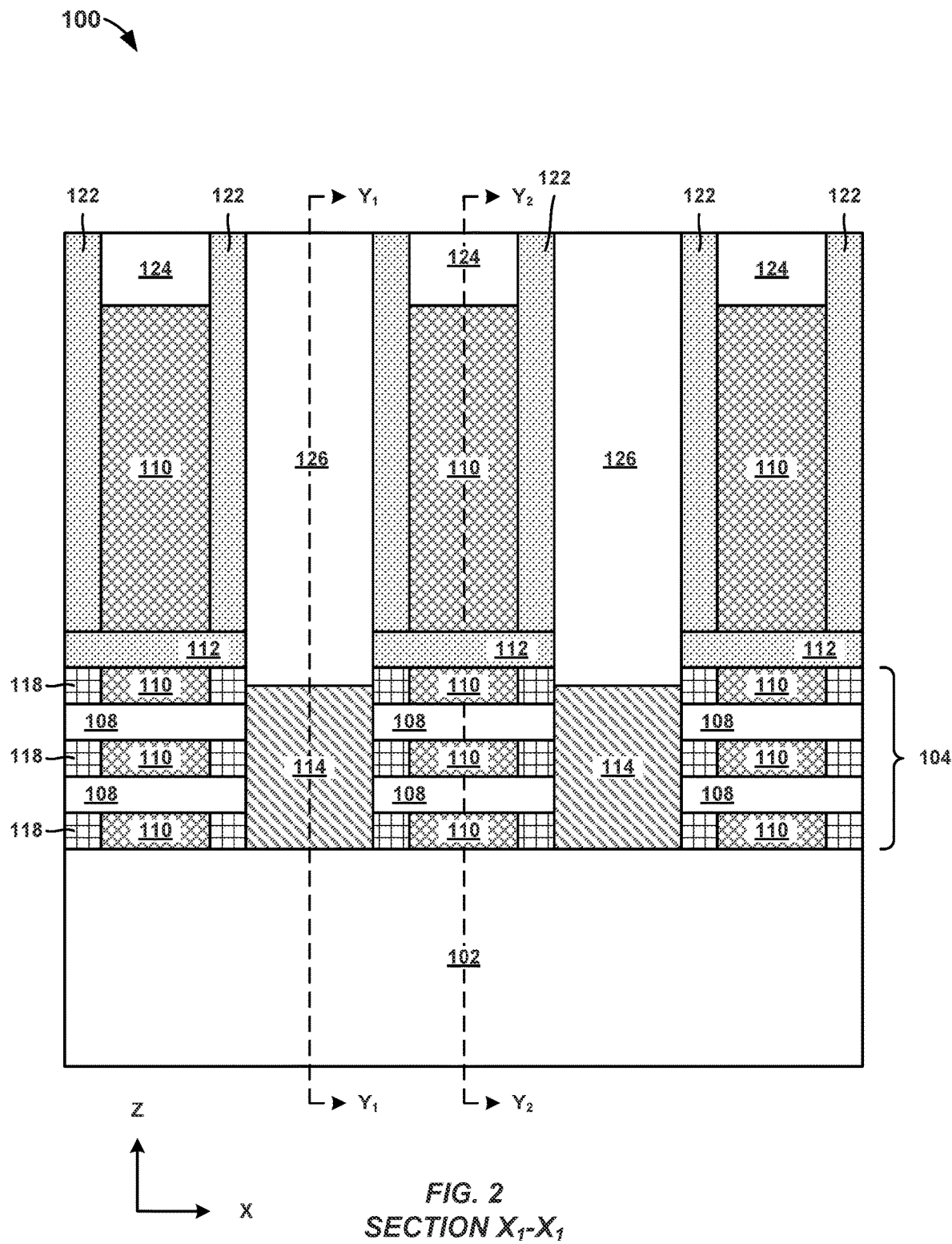
FIGS. 2, 3, 4, and 5 are cross-sectional views of the semiconductor structure depicted in FIG. 1 during an intermediate step of a method of fabricating a stacked transistor structure according to an exemplary embodiment.
Figure 3:
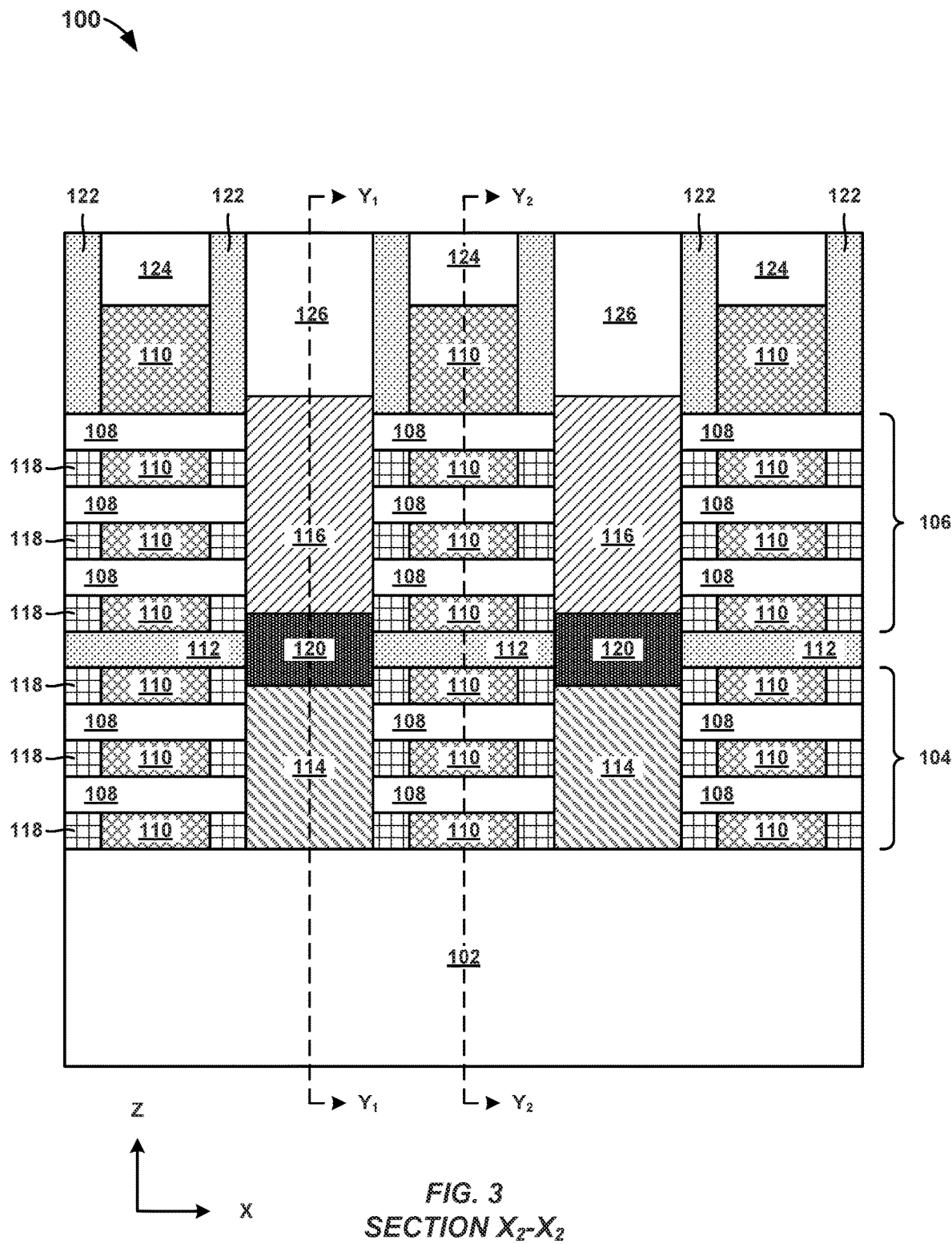
Figure 4:
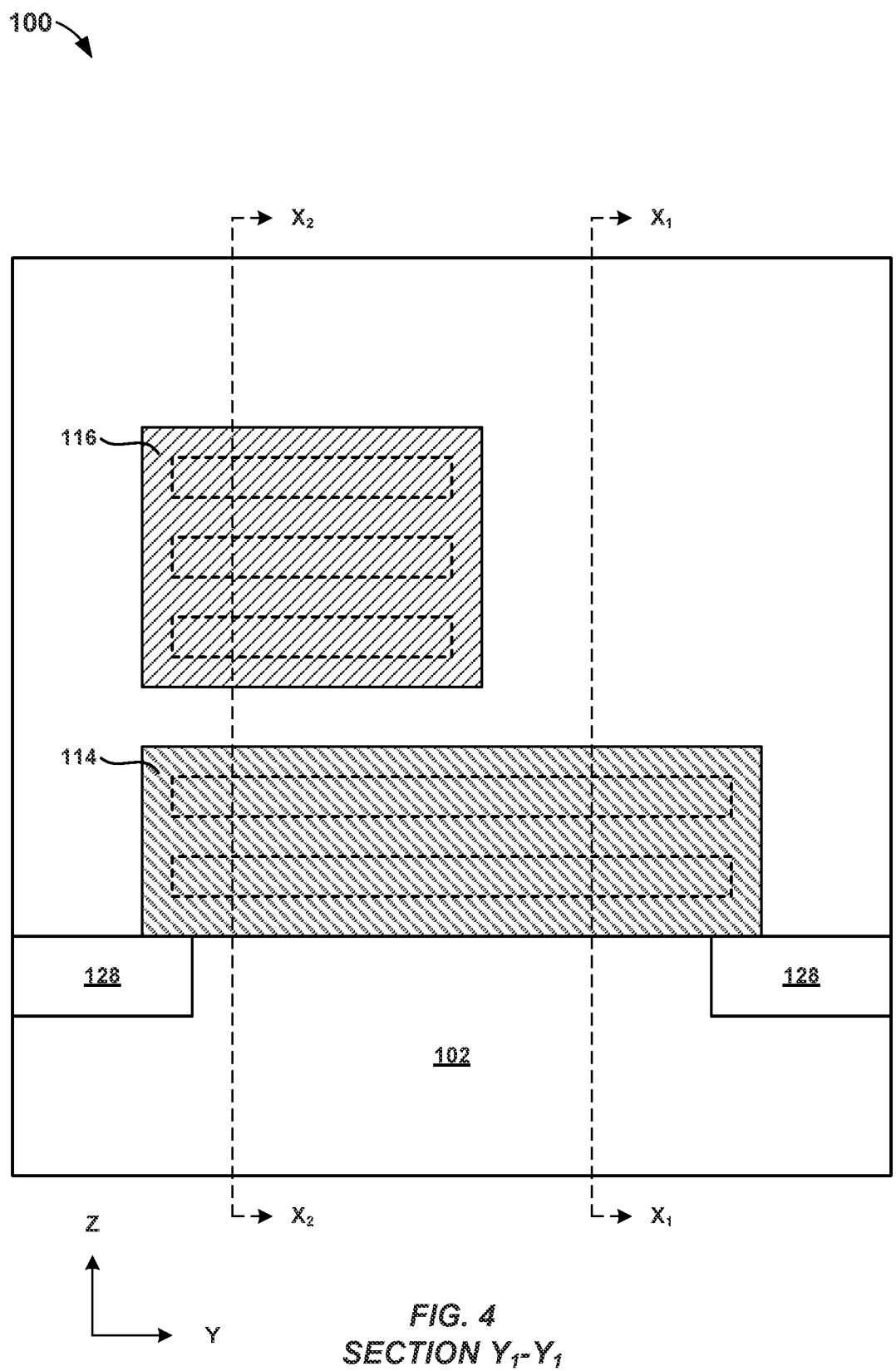
Figure 5:
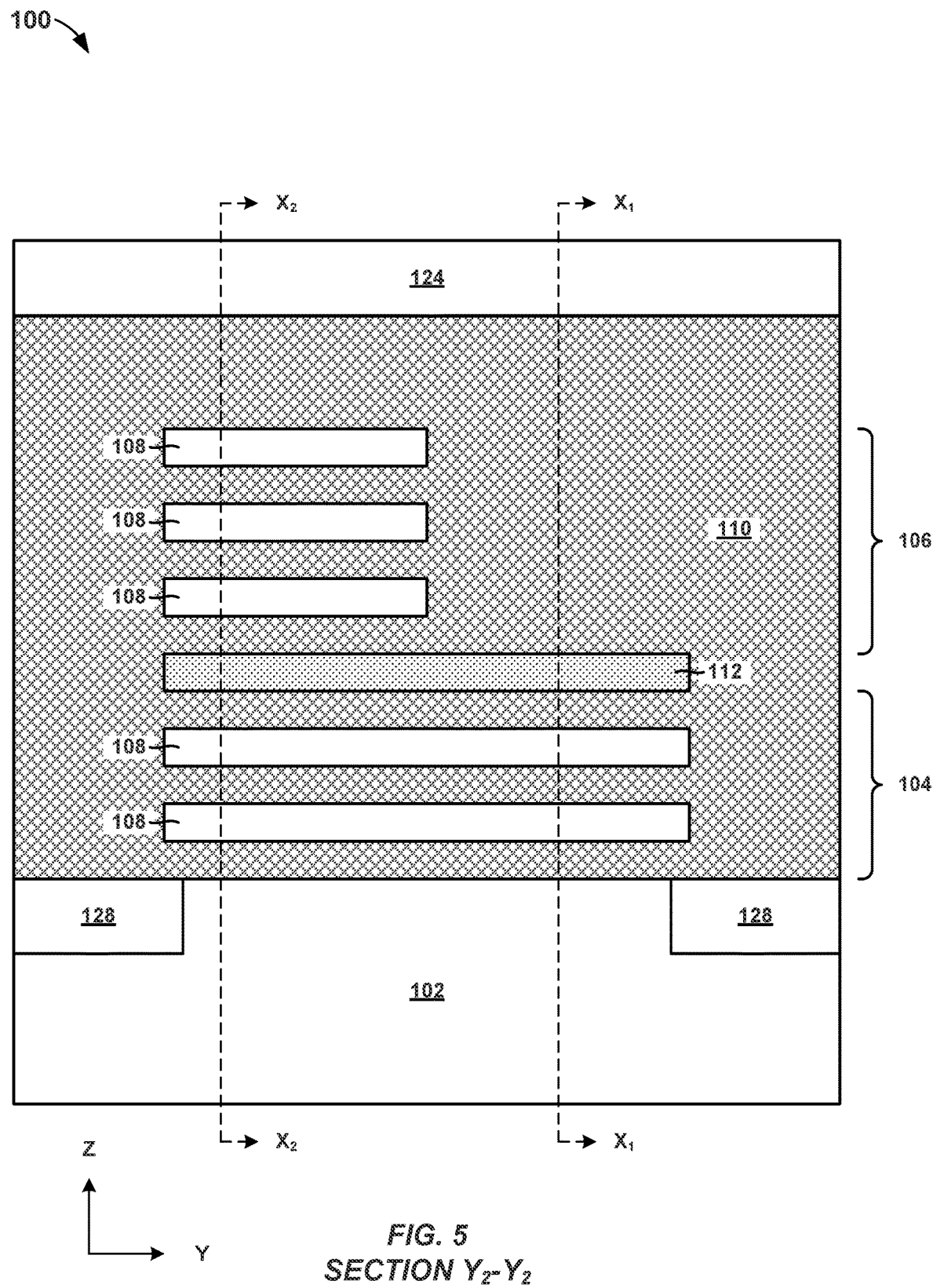

Referring now to FIGS. 1, 2, 3, 4, and 5, a structure 100 is shown during an intermediate step of a method of fabricating a stacked transistor structure according to an embodiment of the invention. FIG. 1 is a representative illustration of a top view of the structure 100 omitting some materials and layers, for example, patterning layers, masking layers and interlevel dielectrics. As such, only pertinent conductive layers and components are shown to provide a clear understanding of their relative orientation. FIG. 2 depicts a cross-sectional view of the structure 100 shown in FIG. 1 taken along line $X_1$-$X_1$. FIG. 3 depicts a cross-sectional view of the structure 100 shown in FIG. 1 taken along line $X_2$-$X_2$. FIG. 4 depicts a cross-sectional view of the structure 100 shown in FIG. 1 taken along line $Y_1$-$Y_1$. FIG. 5 depicts a cross-sectional view of the structure 100 shown in FIG. 1 taken along line $Y_2$-$Y_2$.

The structure 100 illustrated in FIGS. 1-5 includes an array of stacked transistors formed on a substrate 102 in accordance with known techniques. As illustrated, the array of stacked transistors includes bottom nanosheet stacks 104 and top nanosheet stacks 106 each including silicon channels 108 surrounded by a gate conductor 110. The bottom nanosheet stacks 104 are separated from the top nanosheet stacks 106 by a stack isolation layer 112 which is patterned from a sacrificial material (e.g. SiGe with high concentration of Ge) at the same time as the silicon channels 108 of the bottom nanosheet stacks 104 and subsequently replaced with a dielectric material. Critical to the present invention, the bottom nanosheet stacks 104 are laterally wider than the top nanosheet stacks 106, as illustrated in FIG. 5. In other words, the bottom nanosheet stacks 104 are longer than the top nanosheet stacks 106 when measured in a direction parallel with the gate conductor 110, or in the in the y-direction. In general, and as illustrated in FIG. 5 the left side of both stacks may be generally aligned; however, such is not required. In a non-limiting exemplary embodiment, the width of the top nanosheet stacks 106 can range from approximately 15 nm to approximately 80 nm, and the width of the bottom nanosheet stacks 104 can be approximately 20 nm to approximately 40 nm longer than the width of the top nanosheet stacks 106. In at least one embodiment, the bottom nanosheet stacks 104 and the top nanosheet stacks 106 are all patterned together and have a width, in the y-direction, of the bottom nanosheet stacks 104, followed by additional patterning and recessing techniques to cut or trim the top nanosheet stacks 106, as illustrated.

Additionally, bottom source drain regions 114 and top source drain regions 116 are formed between adjacent stacks (104, 106) in direct contact with exposed ends of the silicon channels 108. More specifically, the bottom source drain regions 114 and the top source drain regions 116 are epitaxially grown from the exposed ends of the silicon channels 108 according to known techniques.

The structure 100 further includes inner spacers 118 between alternate channels (108). The inner spacers 118 laterally separate the gate conductor 110 from both the bottom source drain regions 114 and the top source drain regions 116, respectively, as illustrated. The inner spacers 118 provide necessary electrical insulation between the gate conductor 110 and the source drawing regions (114, 116). Dielectric features 120 separate the bottom source drain regions 114 from the top source drain regions 116, as illustrated. The dielectric features 120 provide necessary electrical insulation between the bottom source drain regions 114 and the top source drain regions 116.

When forming the gate conductor 110, top gate spacers 122 and gate caps 124 are added to separate and electrically insulate the gate conductor 110 from subsequently formed structures, such as, for example, contact structures. The top gate spacers 122 are critical for electrically insulating the gate conductor from any subsequently formed source drain regions (for example the top source drain region 116) or contact structures. The gate caps 124 may further protect the gate conductor 110 during subsequent processing. In at least one embodiment, the top gate spacers 122 and the gate caps 124 include silicon nitride, silicon boron nitride, silicon carbon nitride, silicon boron carbon nitride, or other known equivalents.

Although the stack isolation layer 112 is shown as a separate component form the top gate spacers 122, they may, in some embodiments, be made from identical dielectric materials and thus be indistinguishable from one another in the final structure. For example, both the stack isolation layer 112 and the top gate spacers 122 can be made from any of the dielectric materials listed above with respect to the top gate spacers 122. In another example, the stack isolation layer 112 and the top gate spacers 122 can be made different materials. Finally, the existing components are substantially surrounded by a dielectric layer 126, such as known inter-level dielectrics, and adjacent devices can be electrically insulated from one another with conventional shallow trench isolation features 128. In at least one embodiment, the dielectric layer 126 may include silicon oxide. Alternatively, the dielectric layer 126 may include some combination of materials, for example a silicon nitride dielectric liner and a silicon oxide fill.

Although only a limited number of components, devices, or structures are shown, embodiments of the present invention shall not be limited by any quantity otherwise illustrated or discussed herein.

Figure 6:
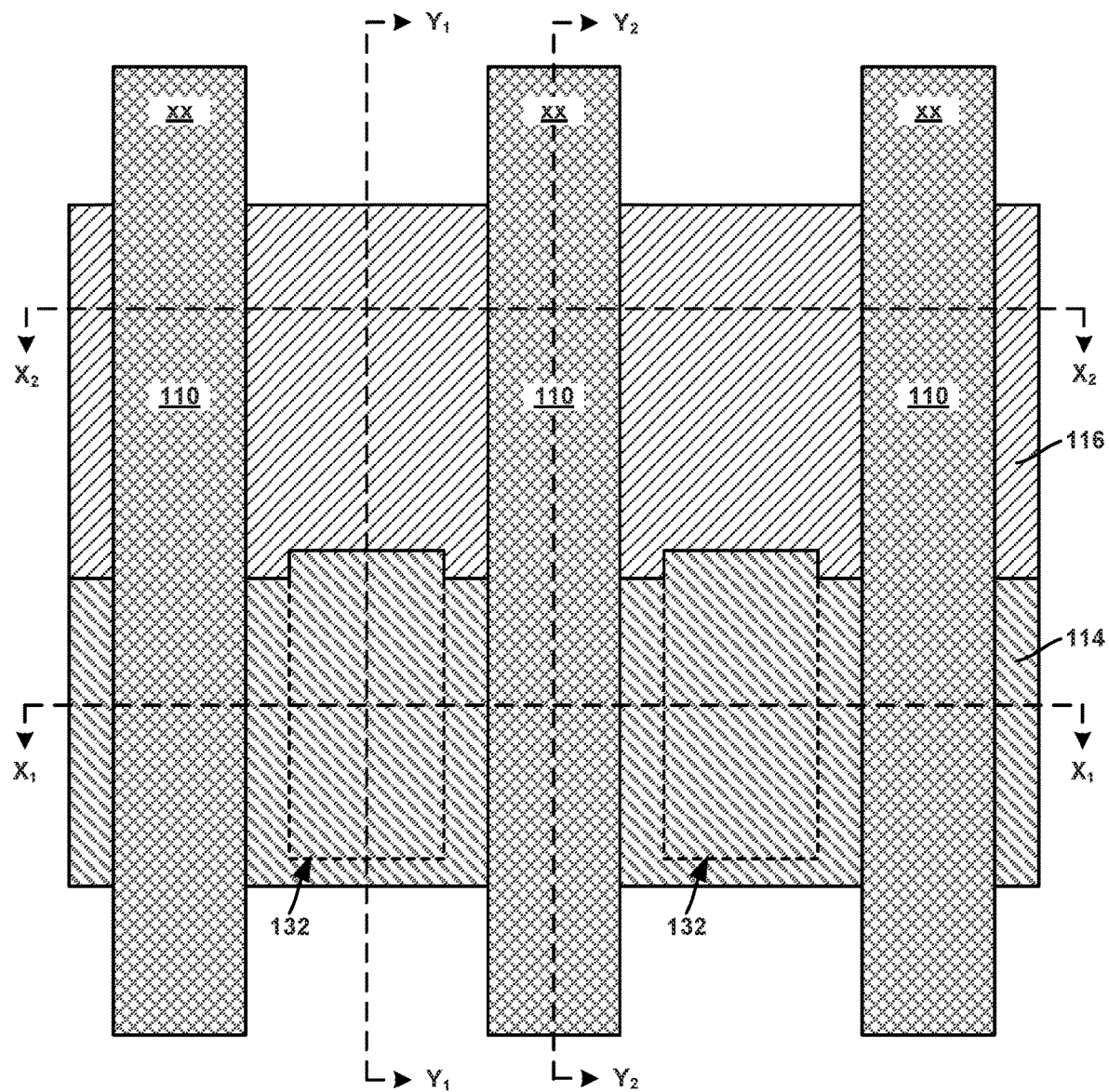
FIG. 6 is a representative illustration of a top view of the structure after forming a mask and removing portions of the dielectric layer to form bottom contact trenches according to an exemplary embodiment.
Figure 7:
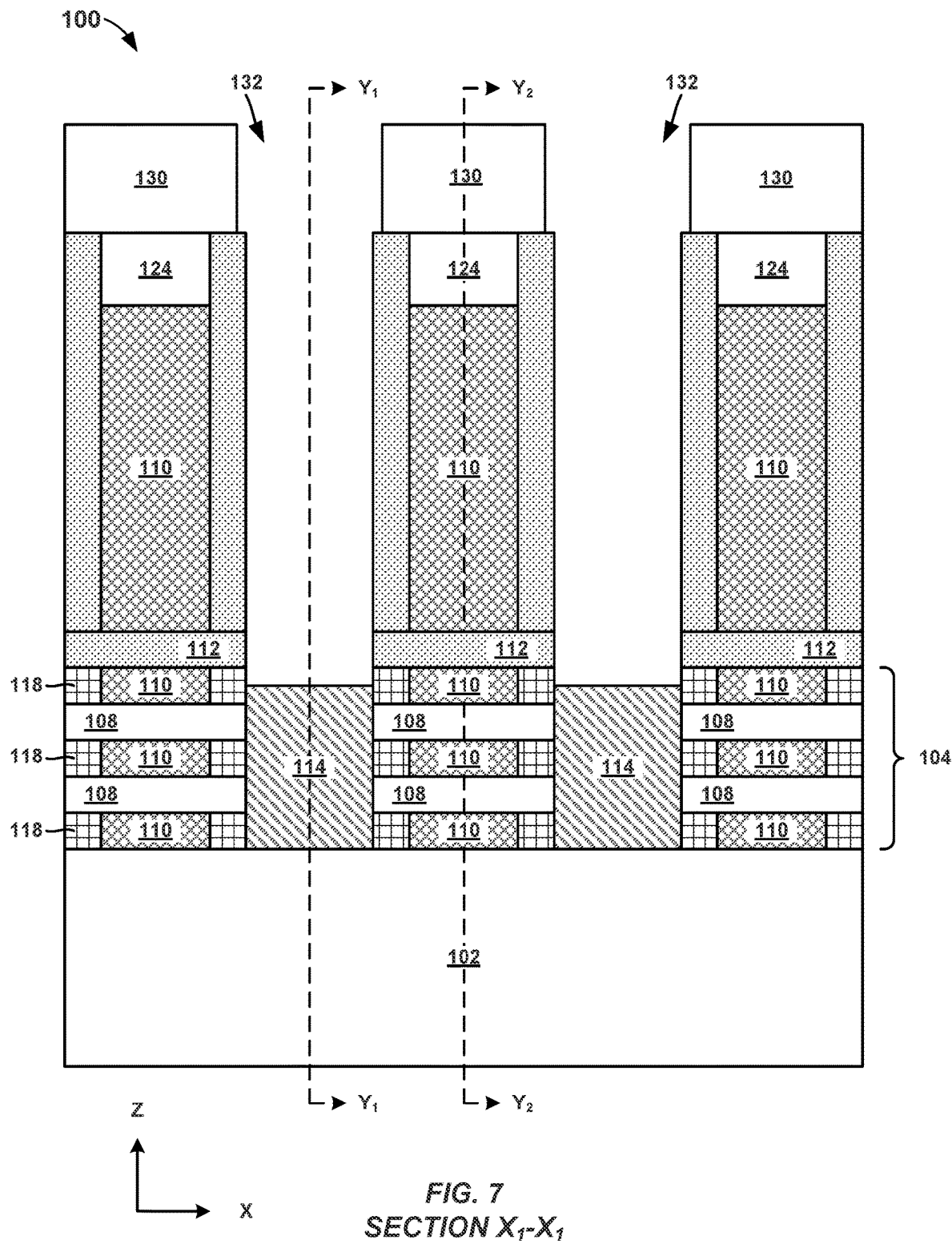
FIGS. 7, 8, 9, and 10 are cross-sectional views of the structure depicted in FIG. 6 according to an exemplary embodiment.
Figure 8:
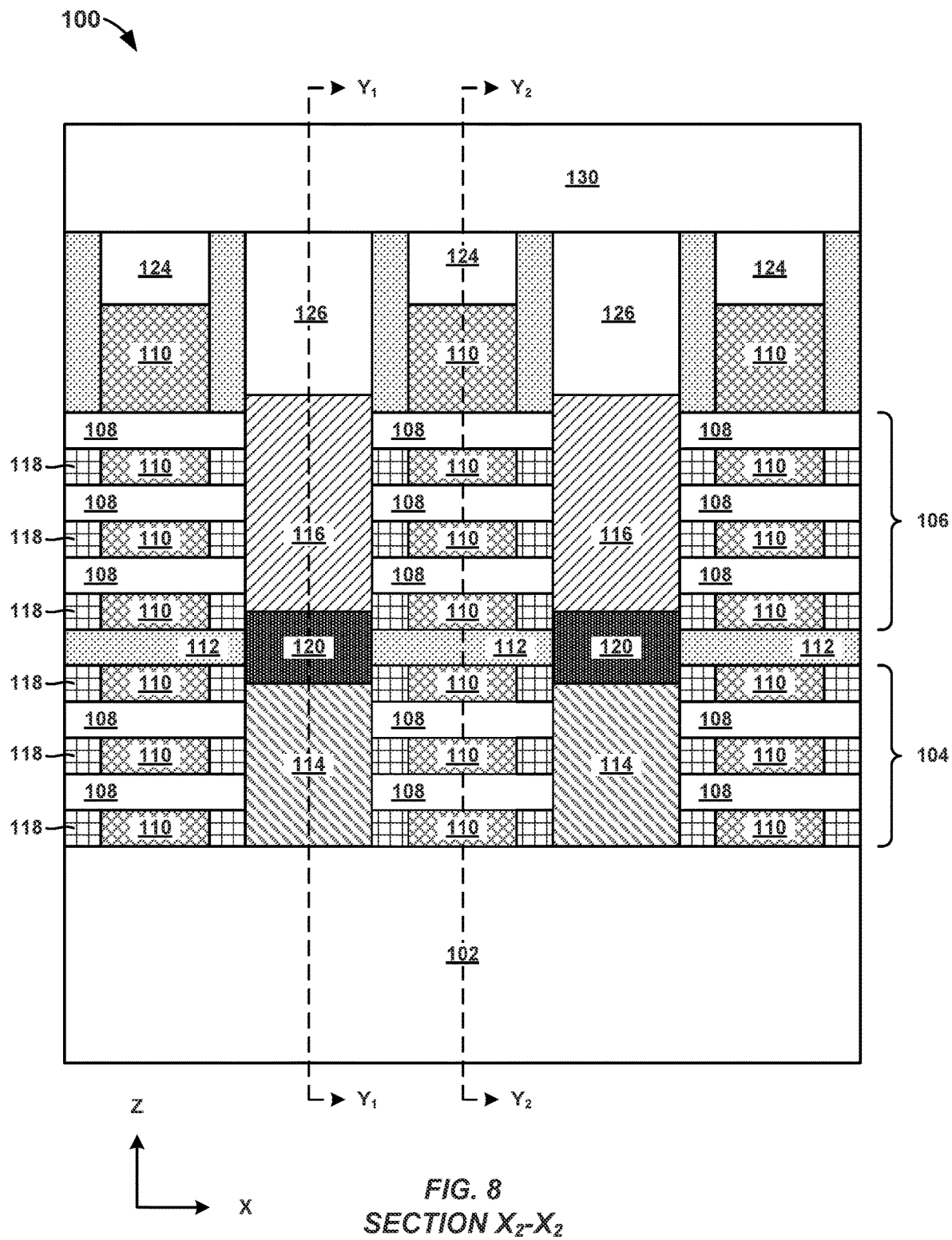
Figure 9:
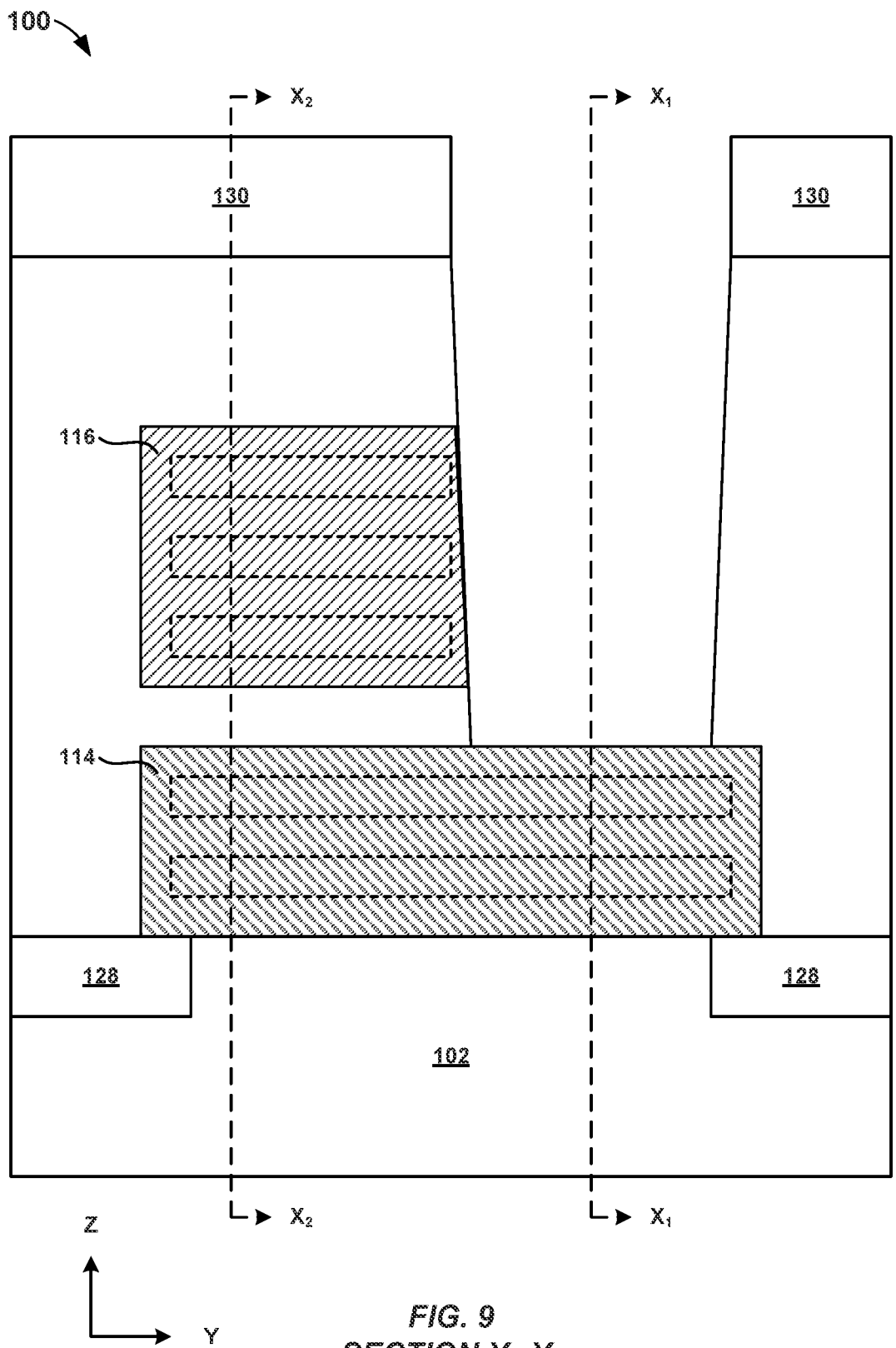
Figure 10:
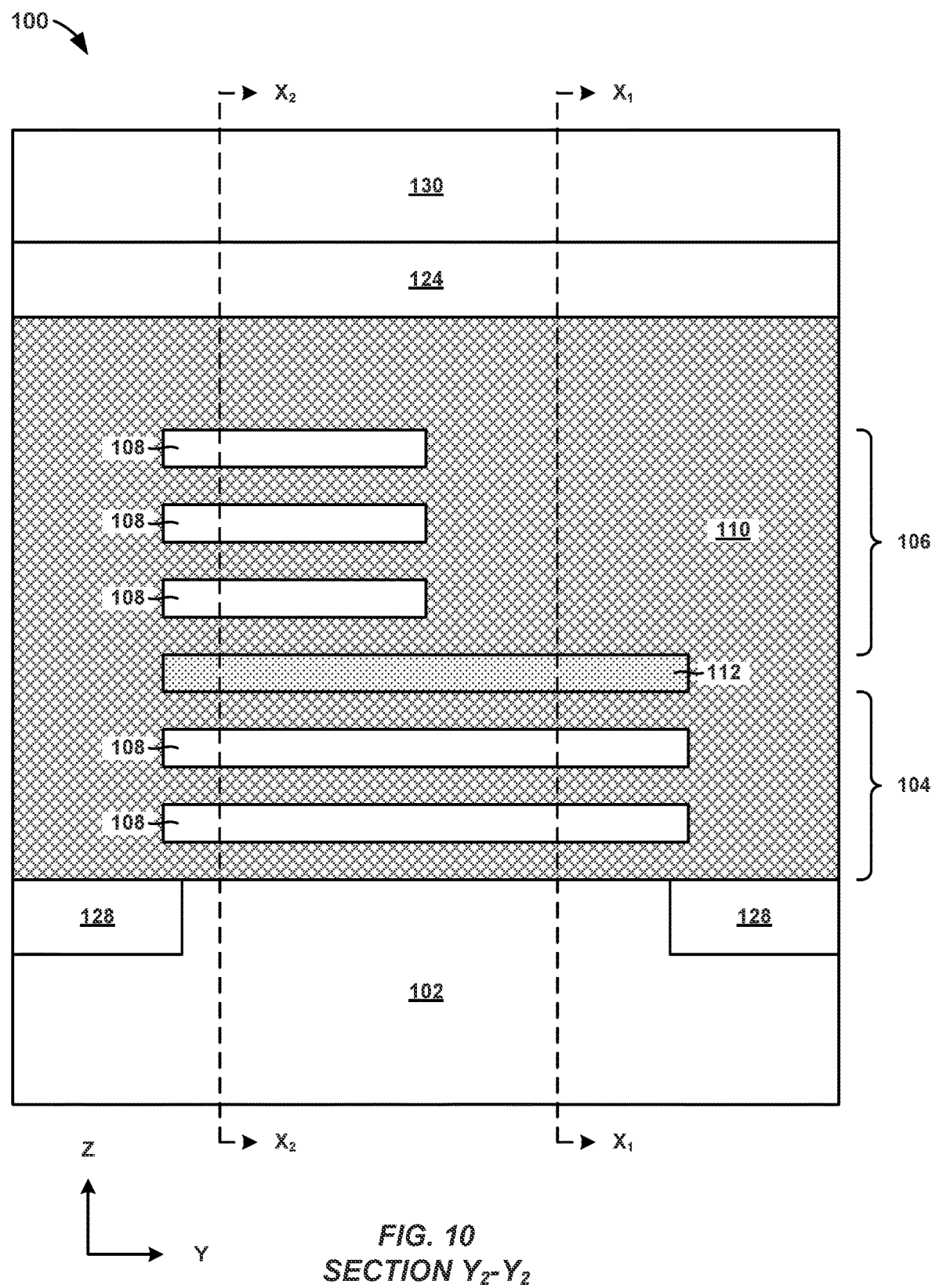

Referring now to FIGS. 6, 7, 8, 9, and 10, a structure 100 is shown after forming a mask 130 and removing portions of the dielectric layer 126 to form bottom contact trenches 132 according to an embodiment of the invention. FIG. 6 is a representative illustration of a top view of the structure 100 omitting some features as described above with reference to FIG. 1. FIG. 7 depicts a cross-sectional view of the structure 100 shown in FIG. 6 taken along line $X_1$-$X_1$. FIG. 8 depicts a cross-sectional view of the structure 100 shown in FIG. 6 taken along line $X_2$-$X_2$. FIG. 9 depicts a cross-sectional view of the structure 100 shown in FIG. 6 taken along line $Y_1$-$Y_1$. FIG. 10 depicts a cross-sectional view of the structure 100 shown in FIG. 6 taken along line $Y_2$-$Y_2$.

First, the mask 130 is deposited and subsequently patterned to expose certain portions of the structure 100 according to known techniques. Specifically, portions of the dielectric layer 126 between the gate conductors 110 and directly above a portion of the bottom source drain regions 114.

According to an embodiment, the mask 130 can be an organic planarization layer (OPL) or a layer of material that is capable of being planarized, etched, or patterned by known techniques. In an embodiment, for example, the mask 130 can be an amorphous carbon layer able to withstand subsequent processing temperatures. The mask 130 can preferably have a thickness sufficient to cover and protect existing structures during subsequent processing. After depositing the mask 130, a dry etching technique is applied to pattern the mask 130. Although general alignment of the mask 130 is important, there is some room for misalignment provided by the top gate spacers 122. In a preferred embodiment, patterning the mask 130 exposes small portions of the uppermost surface of the top gate spacers 122, as shown. Doing so ensures success of subsequent processing steps.

Next, portions of the dielectric layer 126 are selectively removed according to known techniques and until uppermost surfaces of the bottom source drain regions 114 are exposed. Specifically, portions of the dielectric layer 126 are removed selective to the top gate spacers 122. For example, portions of the dielectric layer 126 are removed selective to the top gate spacers 122 using known etching techniques, suitable to remove interlevel dielectrics selective to silicon nitride, or the chosen material of the top gate spacers 122. In at least an embodiment, a directional dry etch technique, such as reactive ion etching, is used to selectively remove portions of the dielectric layer 126, as shown. Such techniques are commonly referred to as "self-aligned" etching techniques because the top gate spacers 122 form at least two boundaries of the resulting trench. As such, the bottom contact trenches 132 may also be referred to as a self-aligned contact trenches.

In all cases, vertical sidewalls of the top gate spacer 122 must be exposed after removing portions of the dielectric layer 126 and forming the bottom contact trenches 132. Additionally, in some embodiments, portions of the top source drain regions 116 may be etched or removed during etching to form the contact trenches 132. Although removing portions of the top source drain regions 116 is not necessarily an object of the invention, it is a very likely result in view of the tight pitch and limited space. In other embodiments, portions of the bottom source drain regions 114 may be removed during forming of the bottom contact trenches 132. For example, an uppermost surface of the bottom source drain regions 114 may generally be used as an etch stop; however, etching may continue and remove a small portion of the bottom source drain regions 114 (not shown).

Figure 11:
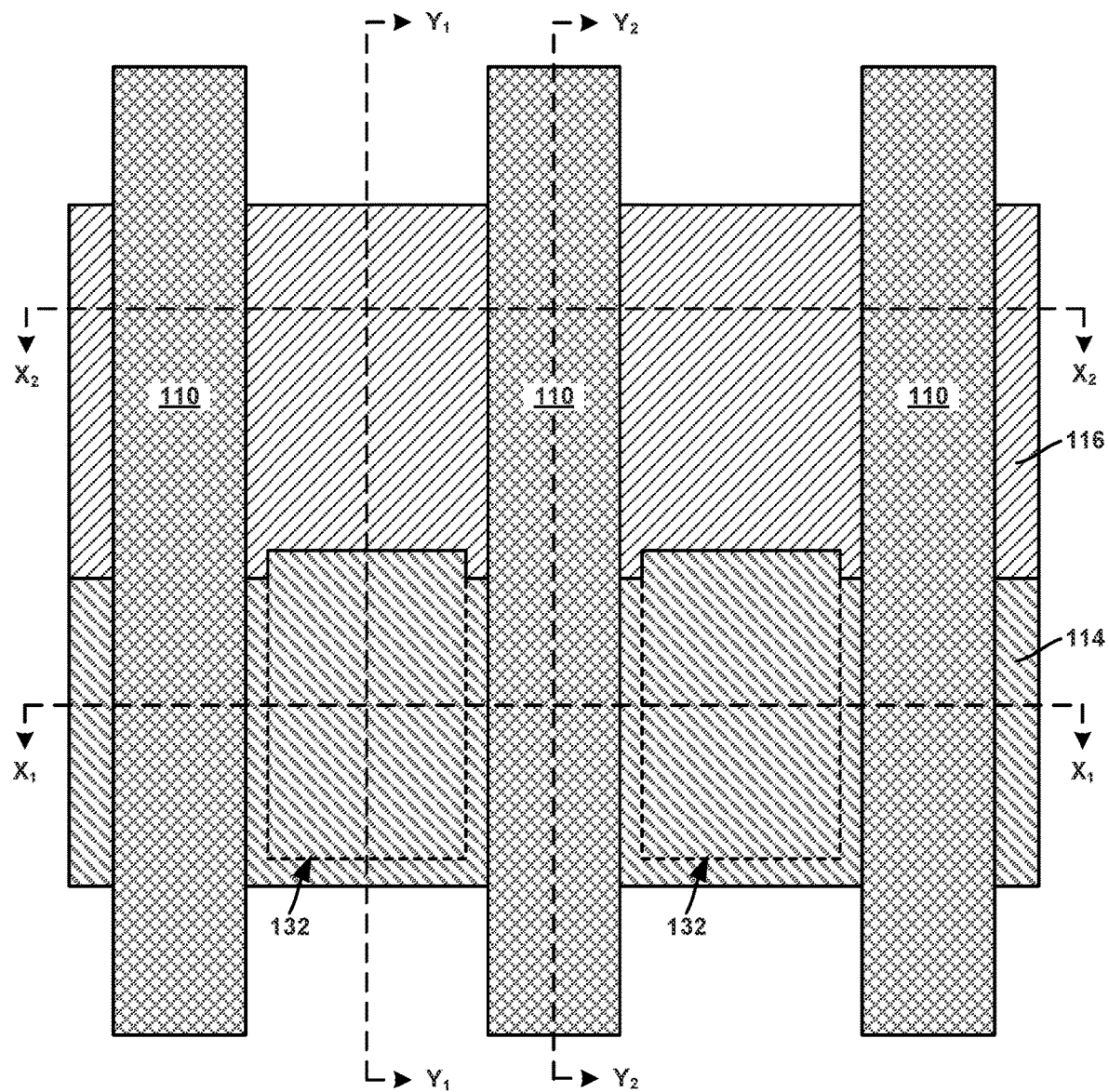
FIG. 11 is a representative illustration of a top view of the structure after laterally recessing the top gate spacer, the stack isolation layer, and the inner spacers according to an exemplary embodiment.
Figure 12:
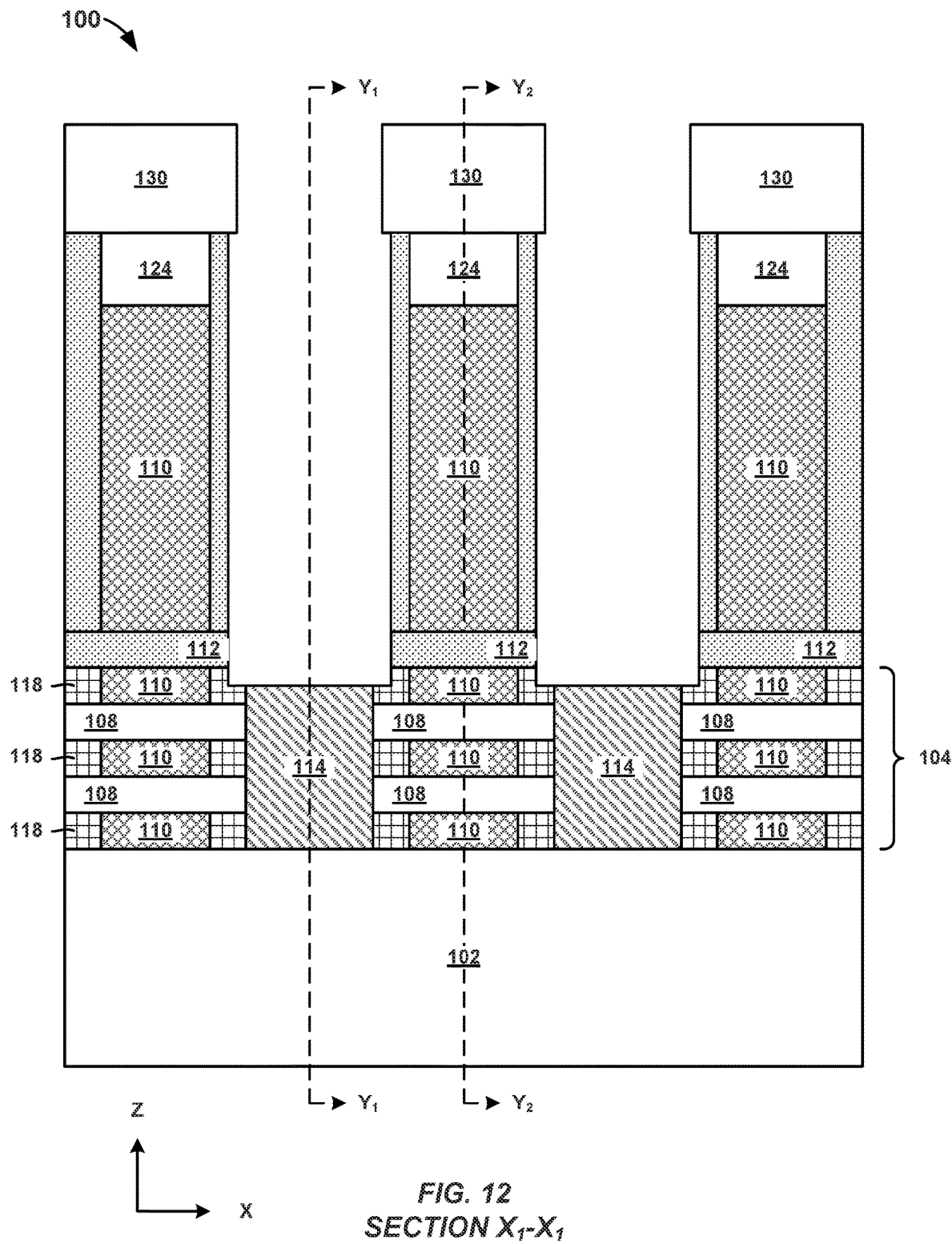
FIGS. 12, 13, 14, and 15 are cross-sectional views of the structure depicted in FIG. 11 according to an exemplary embodiment.
Figure 13:
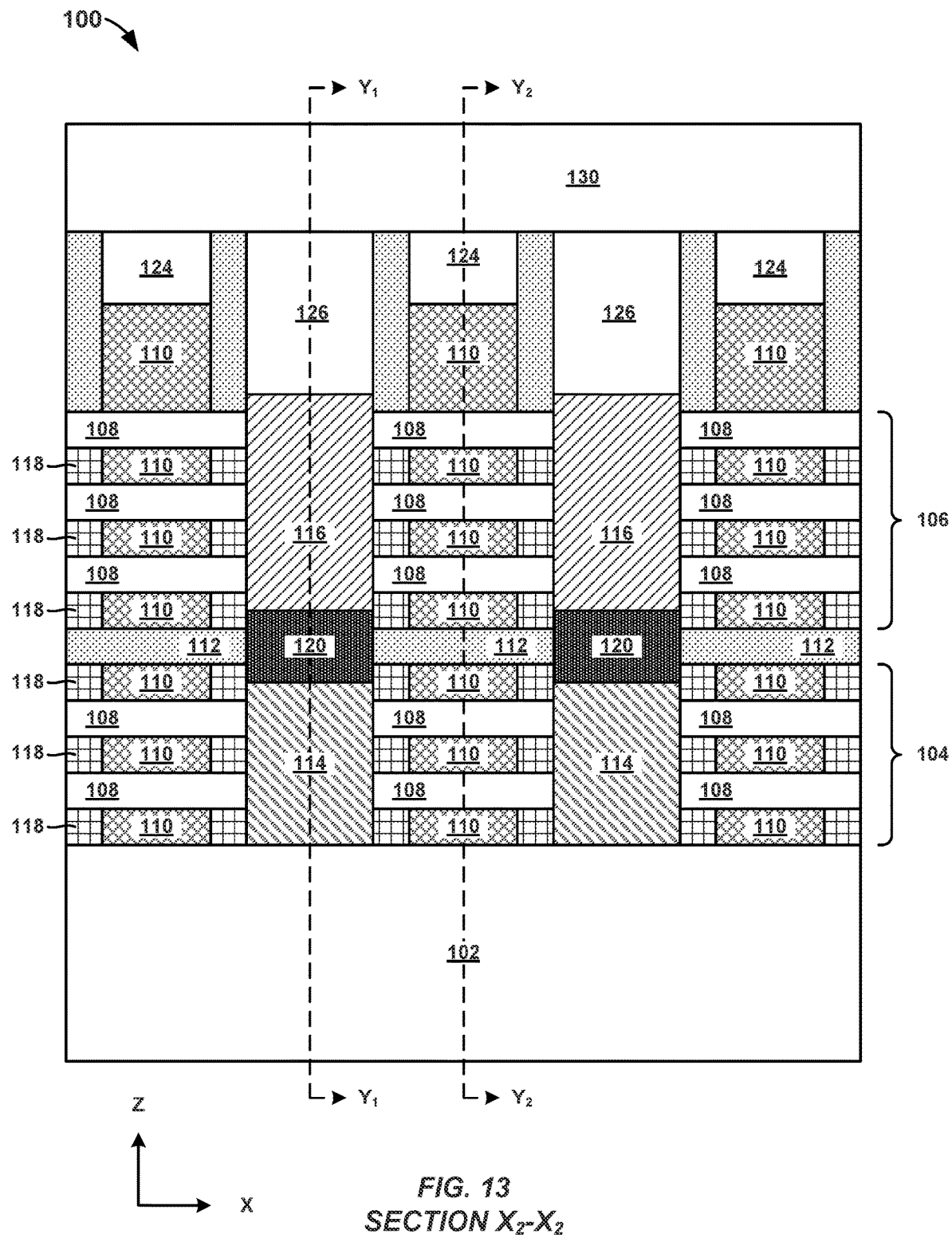
Figure 14:
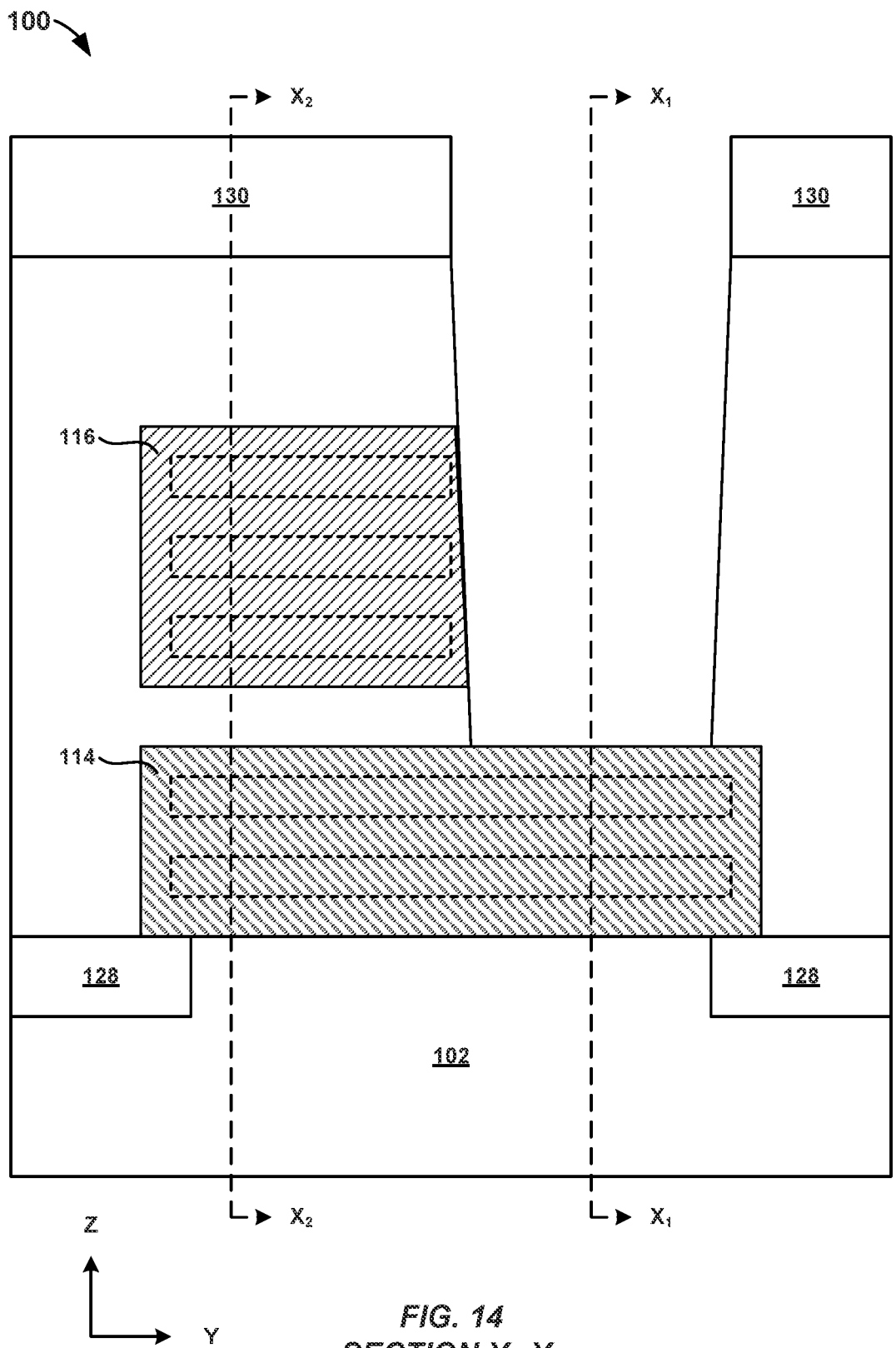
Figure 15:
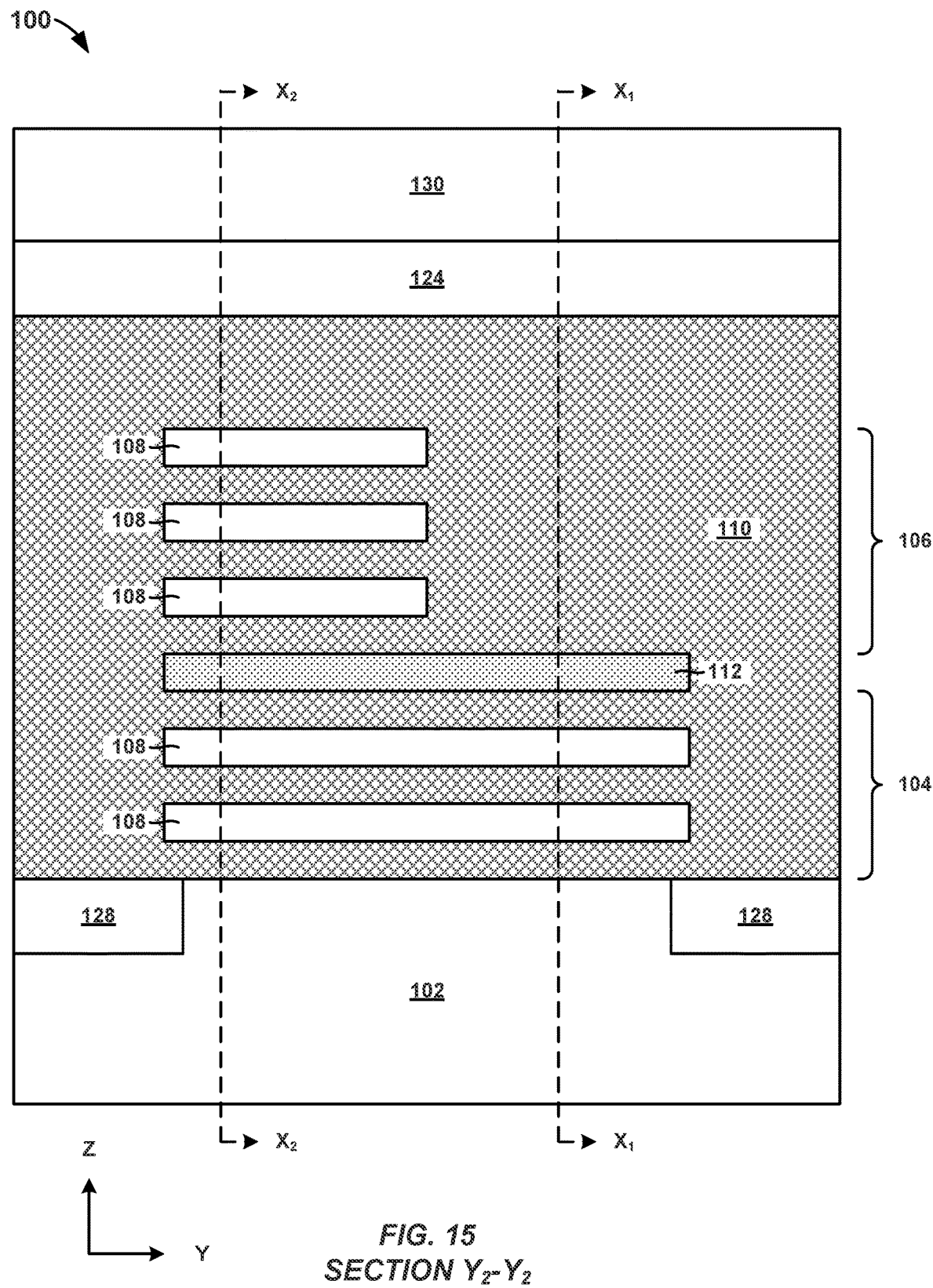

Referring now to FIGS. 11, 12, 13, 14, and 15, a structure 100 is shown after laterally recessing the top gate spacer 122, the stack isolation layer 112, and the inner spacers 118 according to an embodiment of the invention. FIG. 11 is a representative illustration of a top view of the structure 100 omitting some features as described above with reference to FIG. 1. FIG. 12 depicts a cross-sectional view of the structure 100 shown in FIG. 11 taken along line $X_1$-$X_1$. FIG. 13 depicts a cross-sectional view of the structure 100 shown in FIG. 11 taken along line $X_2$-$X_2$. FIG. 14 depicts a cross-sectional view of the structure 100 shown in FIG. 11 taken along line $Y_1$-$Y_1$. FIG. 15 depicts a cross-sectional view of the structure 100 shown in FIG. 11 taken along line $Y_2$-$Y_2$.

As illustrated in FIG. 12, exposed portions of the top gate spacer 122, the stack isolation layer 112, and the inner spacers 118 are trimmed or recessed using known isotropic etching techniques. The etch chemistry will depend on the specific materials. For example, if all of the top gate spacer 122, the stack isolation layer 112, and the inner spacers 118 are made from silicon nitride then a wet phosphorous acid may be used. In another example, if all of the top gate spacer 122, the stack isolation layer 112, and the inner spacers 118 are made from silicon boron carbon nitride then a plasma etch may be used. If different materials are used, multiple successive etch techniques may be required to fully trim each of the top gate spacer 122, the stack isolation layer 112, and the inner spacers 118.

Trimming the top gate spacer 122, the stack isolation layer 112, and the inner spacers 118 effectively increases the length, in the x-direction, of the bottom contact trenches 132. It is very important to ensure the length, in the x-direction, of the bottom contact trenches 132 is increased across its entire depth to ensure formation of a usable contact structure as discussed in greater detail below. Stated differently, trimming the top gate spacer 122, the stack isolation layer 112, and the inner spacers 118 is critical to embodiments of the present invention because a useable bottom contact structure would not otherwise be possible. Moreover, trimming the top gate spacer 122 alone, without also trimming the stack isolation layer 112, and the inner spacers 118, would be insufficient because the length, in the x-direction, of the bottom contact trenches 132 would remain narrow at the bottom and undesirably increase contact resistance, as discussed in more detail below.

It is worth noting, in accordance with the embodiments illustrated in the figures, the topmost surface of the bottom source drain regions 114 must be lower than the stack isolation layer 112 in order to expose a small portion of the inner spacers 118. Alternatively, as previously discussed the bottom source drain regions 114 may be recessed a desired amount during formation of the contact trenches 132 in order to expose the inner spacers 118, see FIG. 7. Although not shown, in embodiments where the topmost surface of the bottom source drain regions 114 is not lower than the stack isolation layer 112, etching or trimming of the inner spacers 118 would not be required.

After formation of the bottom contact trenches 132 the mask 130 is removed using known techniques, for example, by ashing.

Figure 16:
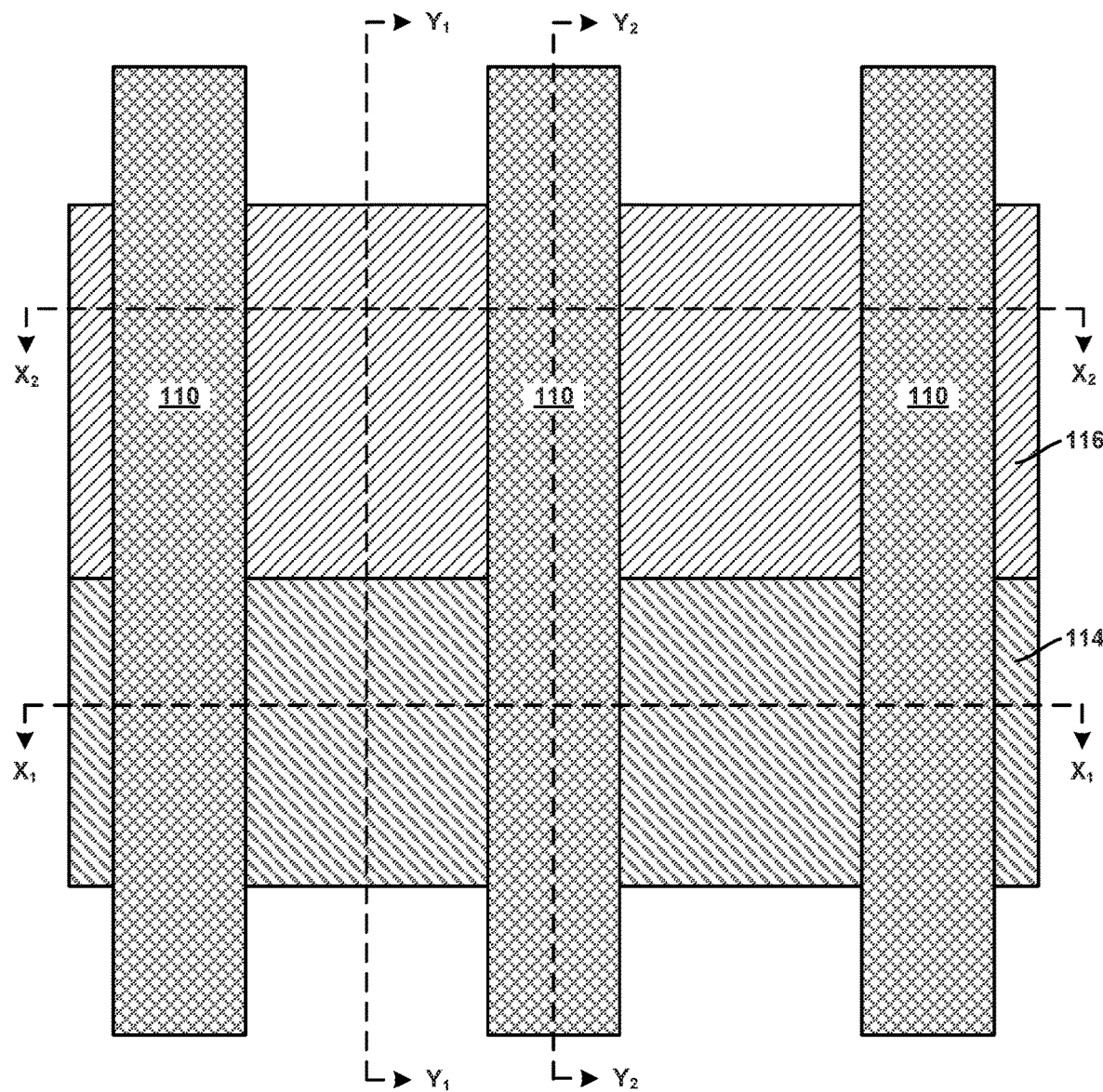
FIG. 16 is a representative illustration of a top view of the structure after forming replacement spacers according to an exemplary embodiment.
Figure 17:
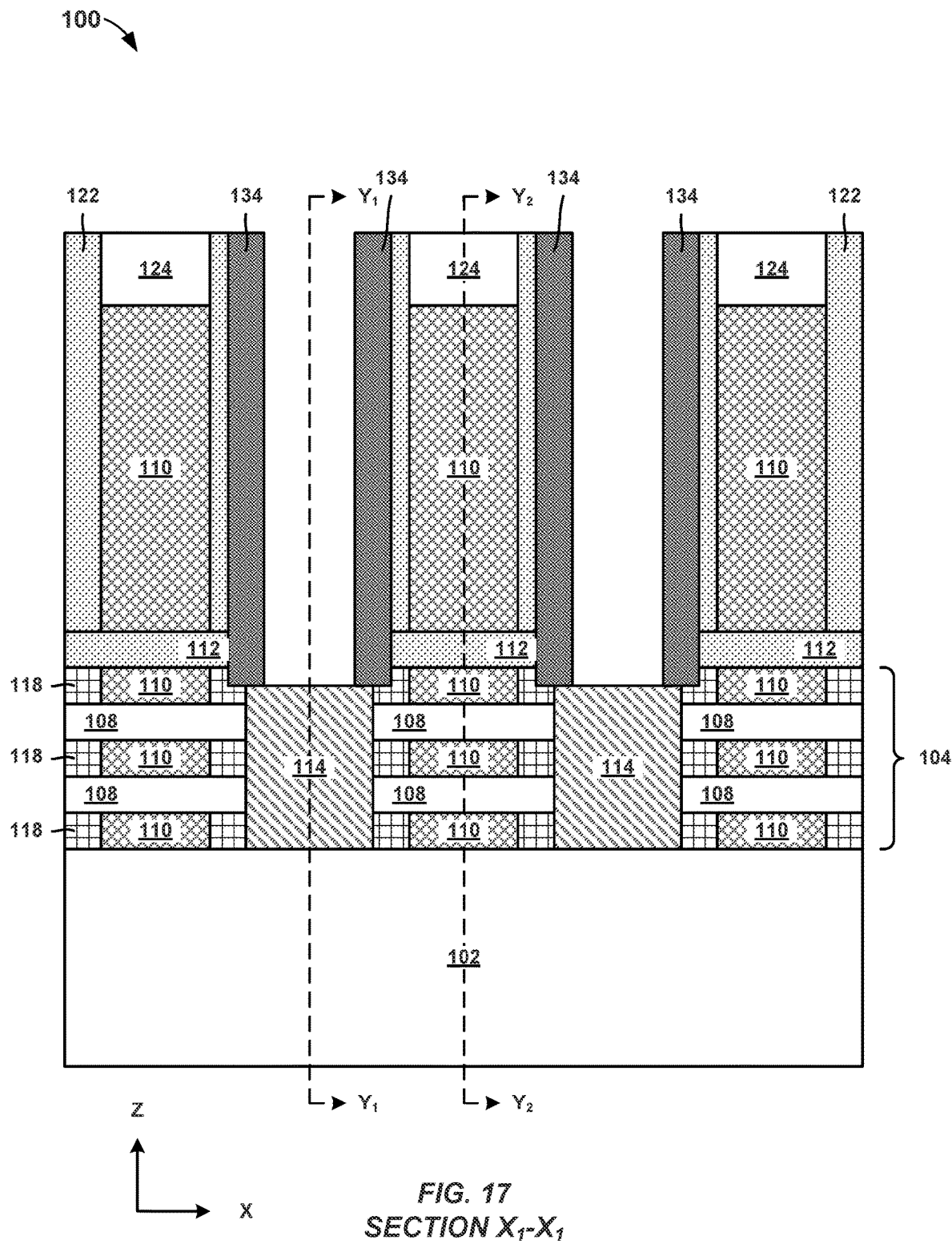
FIGS. 17, 18, 19, and 20 are cross-sectional views of the structure depicted in FIG. 16 according to an exemplary embodiment.
Figure 18:
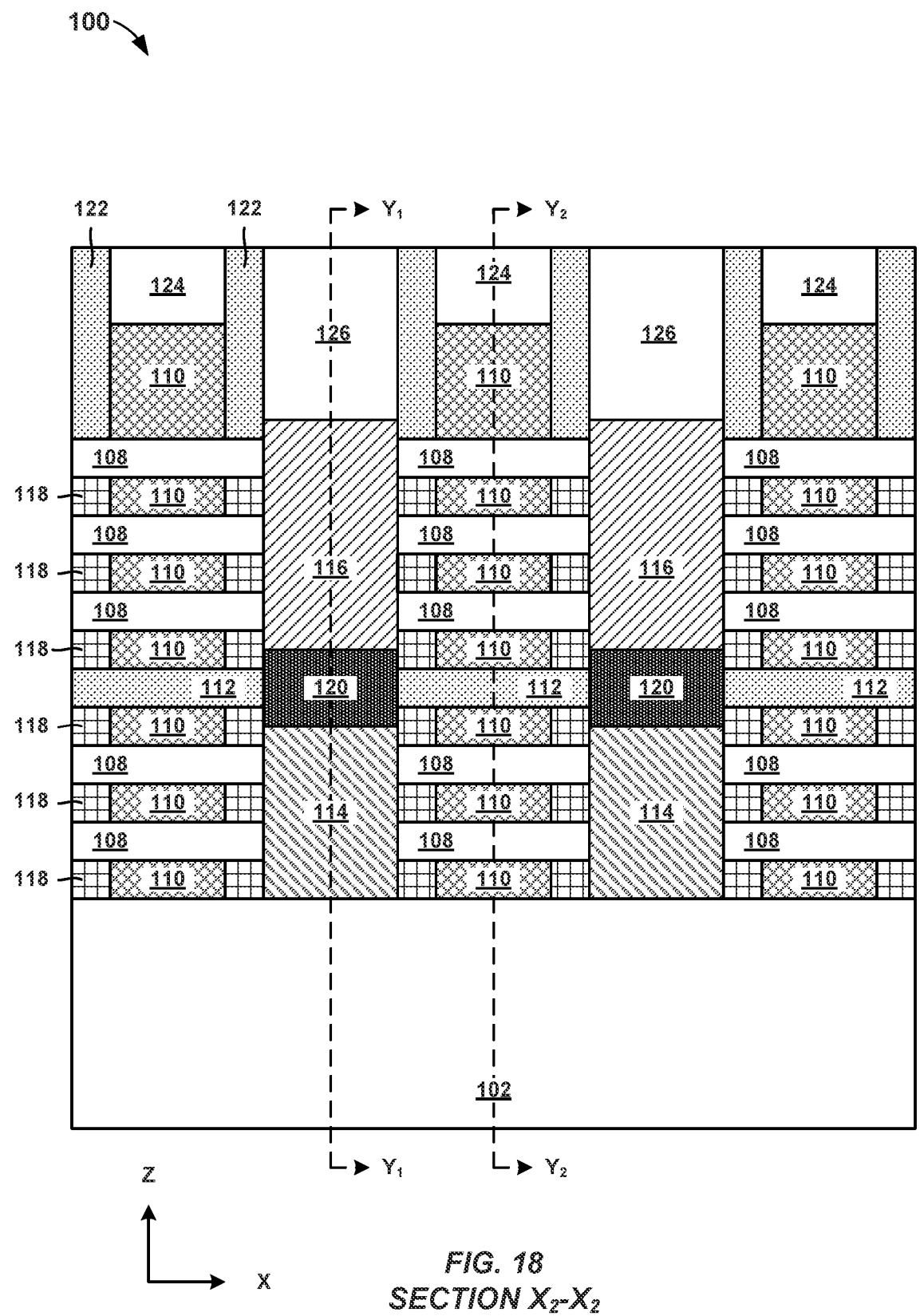
Figure 19:
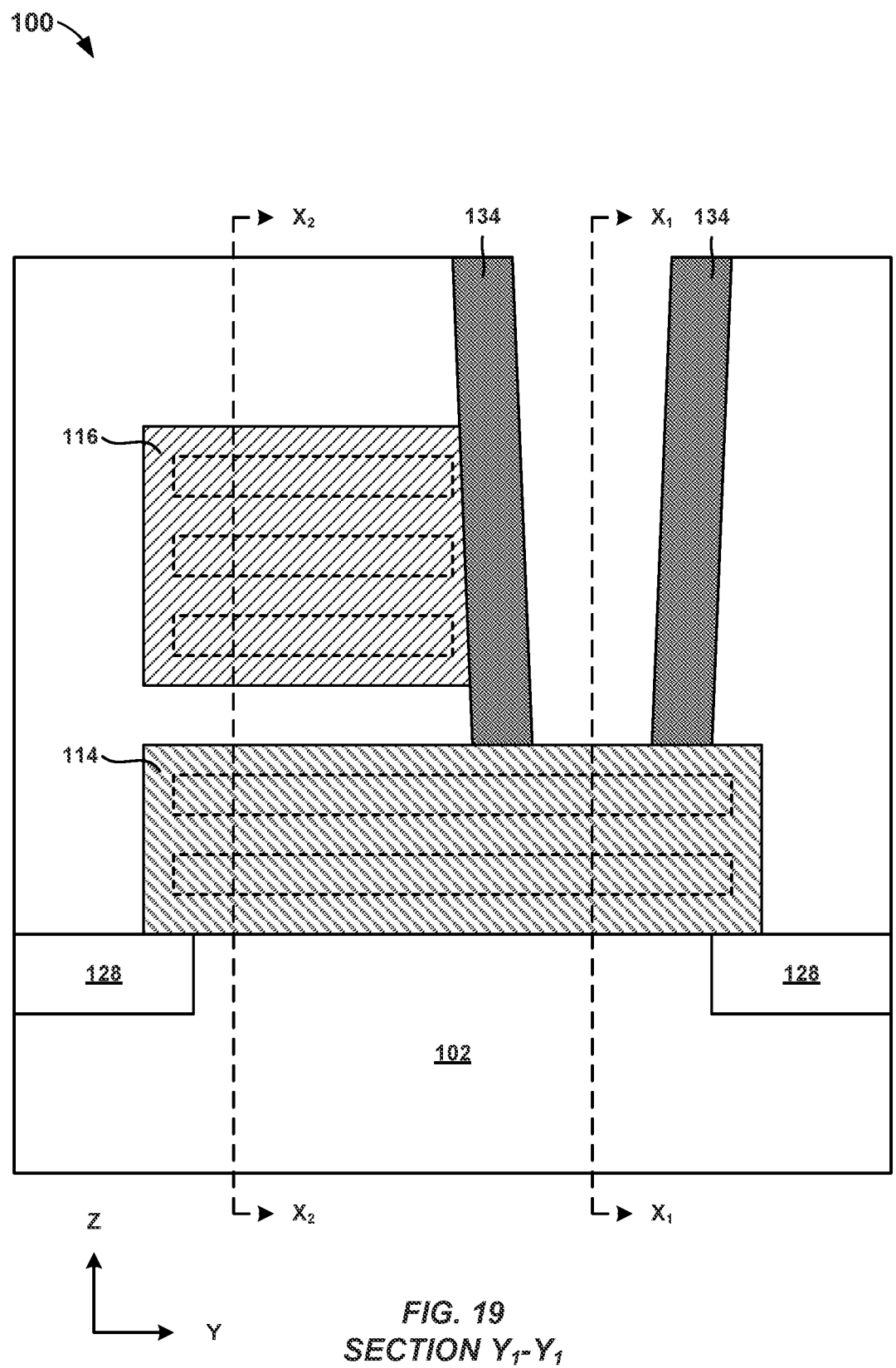
Figure 20:
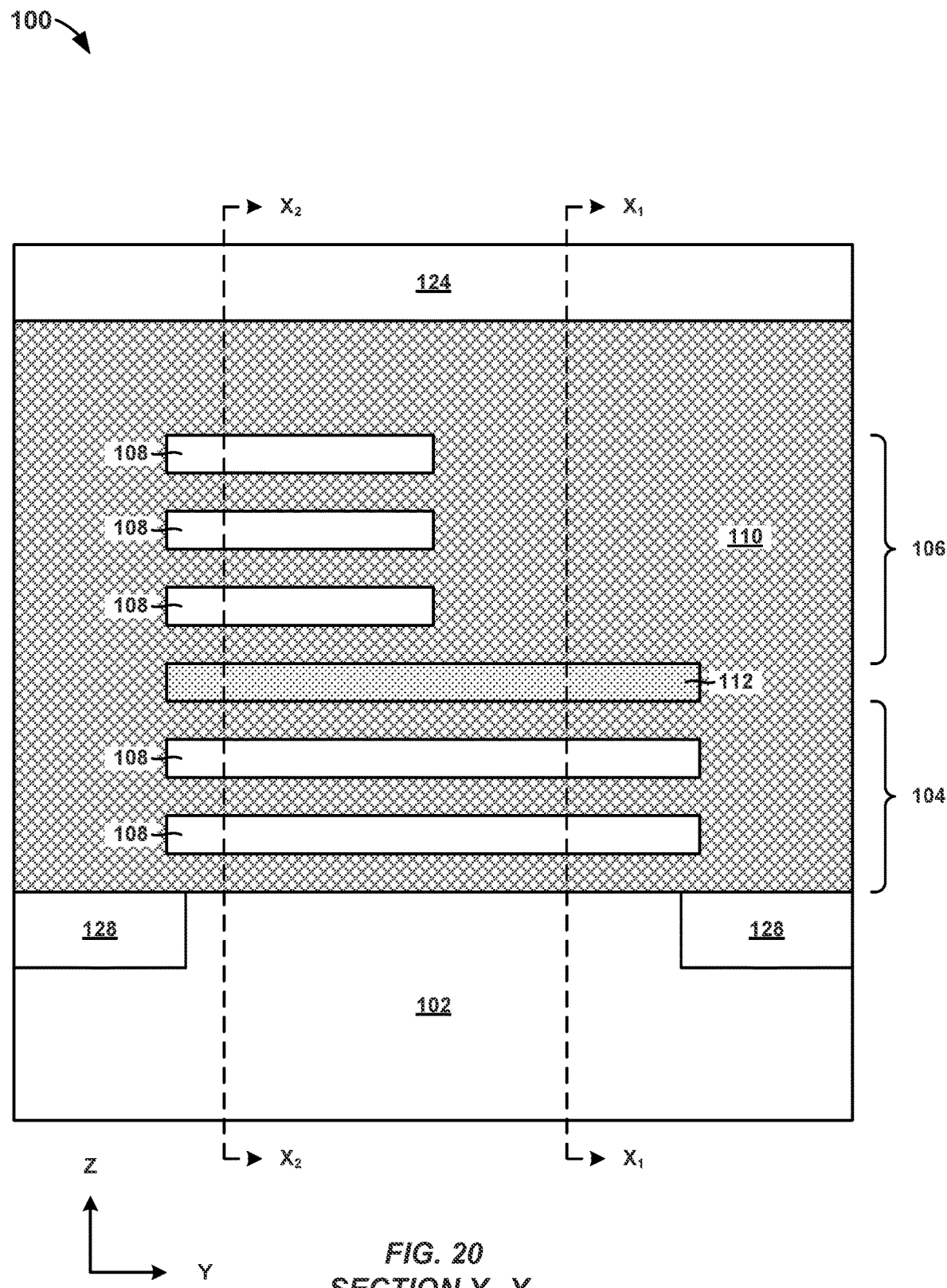

Referring now to FIGS. 16, 17, 18, 19, and 20, a structure 100 is shown after forming replacement spacers 134 according to an embodiment of the invention. FIG. 16 is a representative illustration of a top view of the structure 100 omitting some features as described above with reference to FIG. 1. FIG. 17 depicts a cross-sectional view of the structure 100 shown in FIG. 16 taken along line $X_1$-$X_1$. FIG. 18 depicts a cross-sectional view of the structure 100 shown in FIG. 16 taken along line $X_2$-$X_2$. FIG. 19 depicts a cross-sectional view of the structure 100 shown in FIG. 16 taken along line $Y_1$-$Y_1$. FIG. 20 depicts a cross-sectional view of the structure 100 shown in FIG. 16 taken along line $Y_2$-$Y_2$.

The replacement spacers 134 must be formed along sidewalls of the bottom contact trench 132. The replacement spacers 134 are critical to provide electrical insulation between subsequently formed contact structures and the top source drain regions 116. As a recap, portions, or sidewalls, of the top source drain regions 116 were exposed during forming of the bottom contact trenches 132. For example, forming contract structures directly in the bottom contact trenches 132 without the replacement spacers 134 would result in direct contact, and thus a short, between the contact structures and the top source drain regions 116.

As illustrated in FIG. 17, opposite sidewalls of the bottom contact trenches 132 would be lined with both the top gate spacer 122 and the replacement spacer 134, and thus limit the length, in the x-direction, of any subsequently formed contact structure. For example, if the spacing or length of the bottom source drain regions 114, and similarly the bottom contact trenches 132, were approximately 17 nm, and the replacement spacers 134 are each about 6 nm thick, only 5 nm remains to form the contact structure. A very narrow or skinny contact structure limits the contact area between the bottom source drain regions 114 and thereby significantly increase the contact resistance. As such, embodiments of the present invention propose trimming the top gate spacer 122 to make room for the replacement spacer 134, which is necessary (see FIG. 19). Therefore, as referenced above, trimming the top gate spacer 122 is critical to the successful fabrication and function of any resulting device.

In a typical fashion, the replacement spacers 134 are deposited in a conformal manner followed by a directional etching technique to remove portions of the replacement spacer 134 and expose the bottom source drain regions 114, as illustrated in FIG. 19. The replacement spacers 134 should be deposited with a thickness sufficient to ensure the necessary electrical isolation. The final thickness of the replacement spacers 134 should also be limited in an effort to maximize the contact area and limit contact resistance, as discussed above. According to an embodiment, the replacement spacers 134 can have a thickness ranging from about 4 nm to about 6 nm. Additionally, the replacement spacers 134 can be made from the same or different materials as the top gate spacers 122. In at least one embodiment, the replacement spacers 134 are made from a different materials than the top gate spacers 122 in order to prevent etching, or degradation of the top gate spacers 122 when applying the directional etch to remove portions of the replacement spacers 134 from horizontal surfaces.

Conceptually, similar results could be achieved by designing the bottom source drain regions 114 significantly longer than the top source drain regions 116; however, doing so is not practical because it would consume too much real estate on the wafer and compete with scaling efforts.

Figure 21:
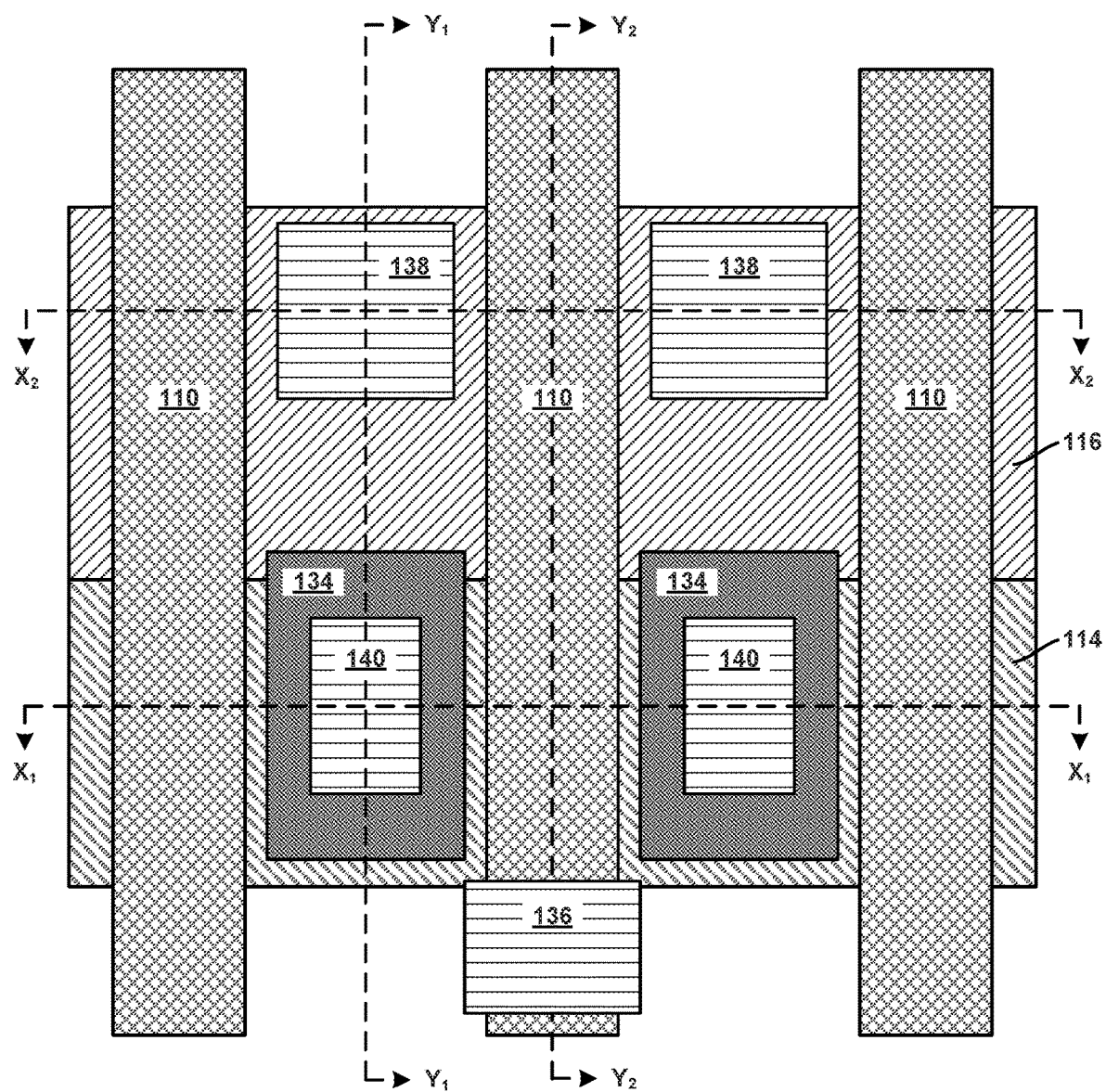
FIG. 21 is a representative illustration of a top view of the structure after forming gate contact trenches (not shown) and top contact trenches (not shown), and subsequently filling the gate contact trenches, the top contact trenches, and the bottom contact trenches with a conducive material to form gate contacts, top contacts and bottom contacts according to an exemplary embodiment.
Figure 22:
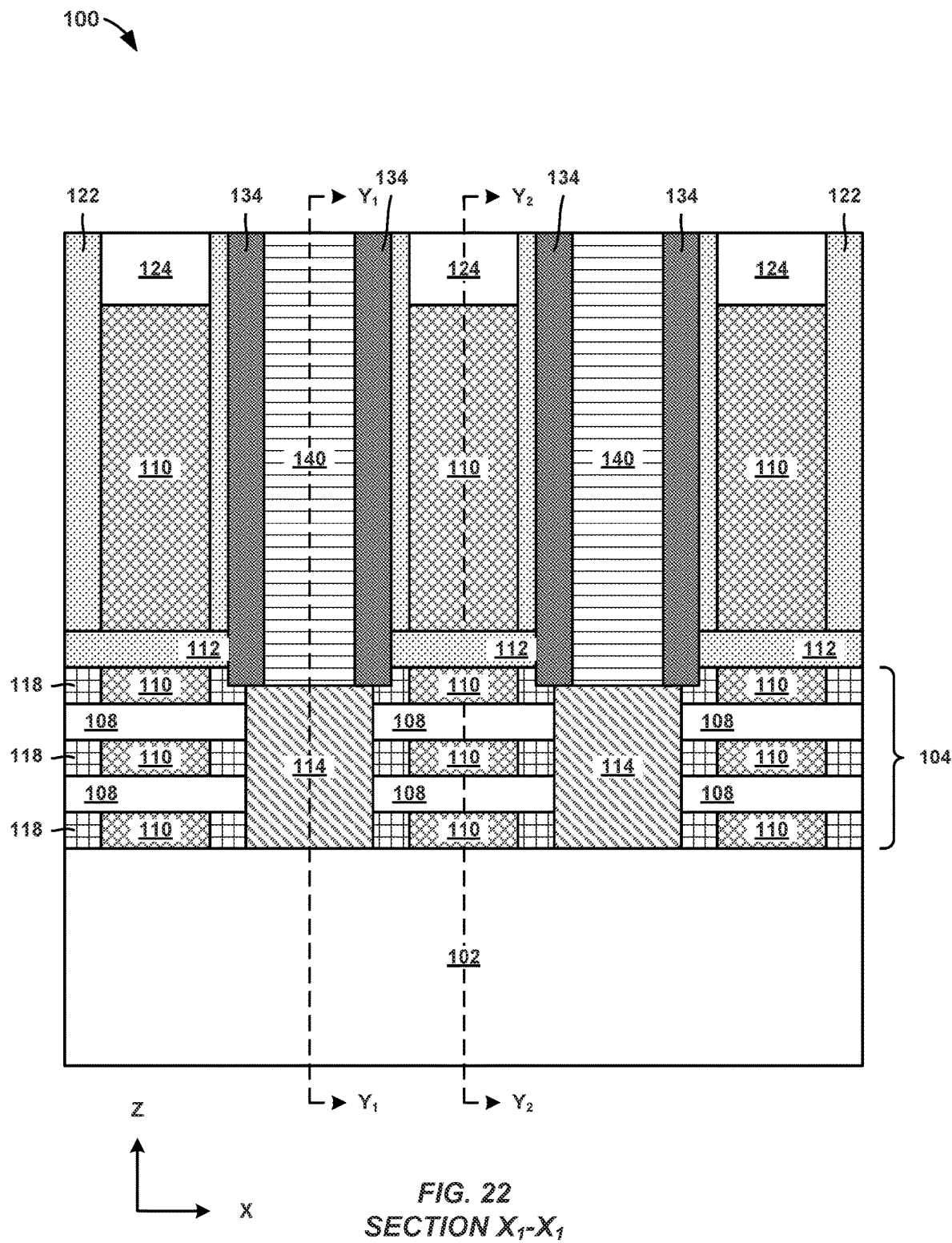
FIGS. 22, 23, 24, and 25 are cross-sectional views of the structure depicted in FIG. 21 according to an exemplary embodiment.
Figure 23:
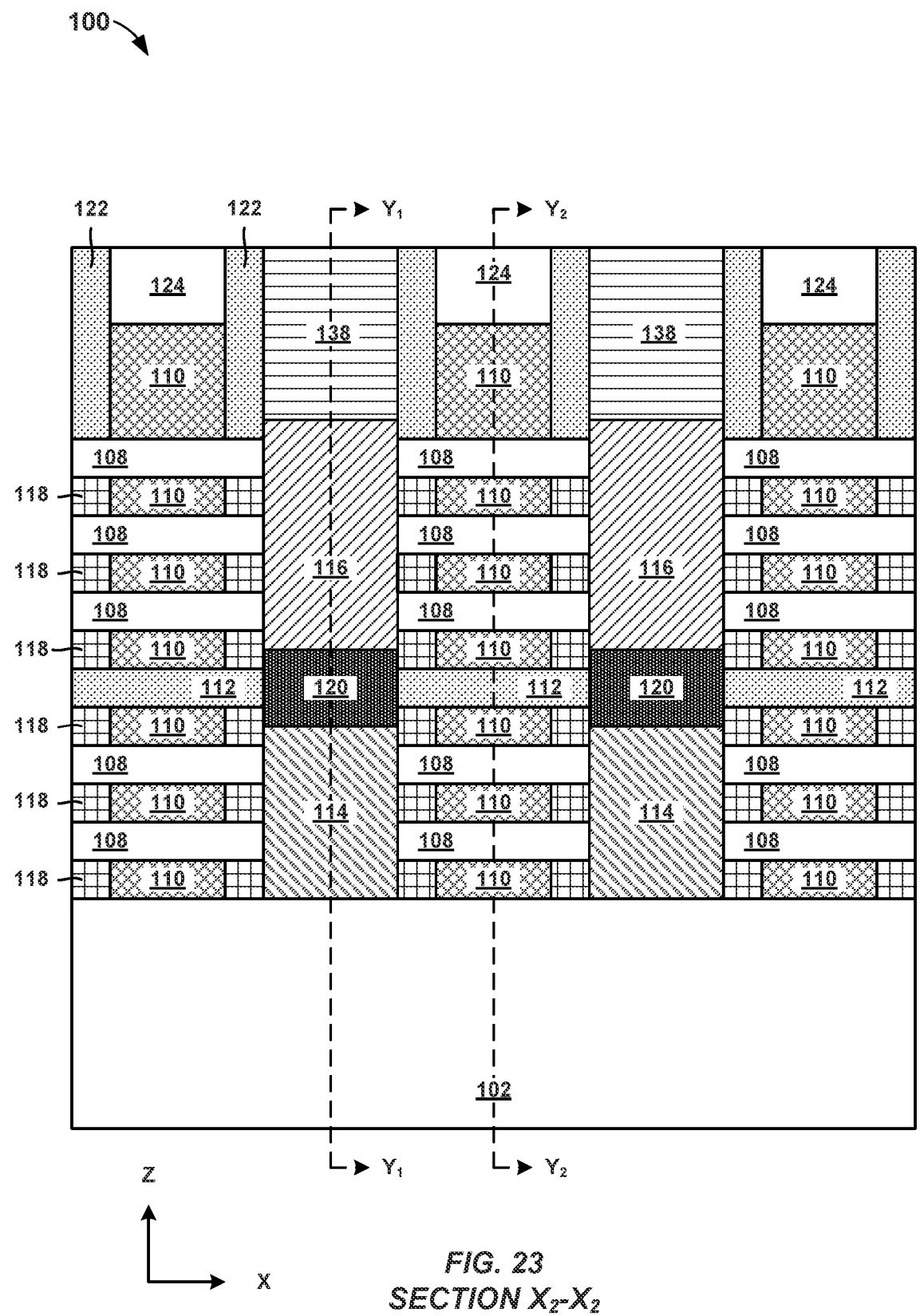
Figure 24:
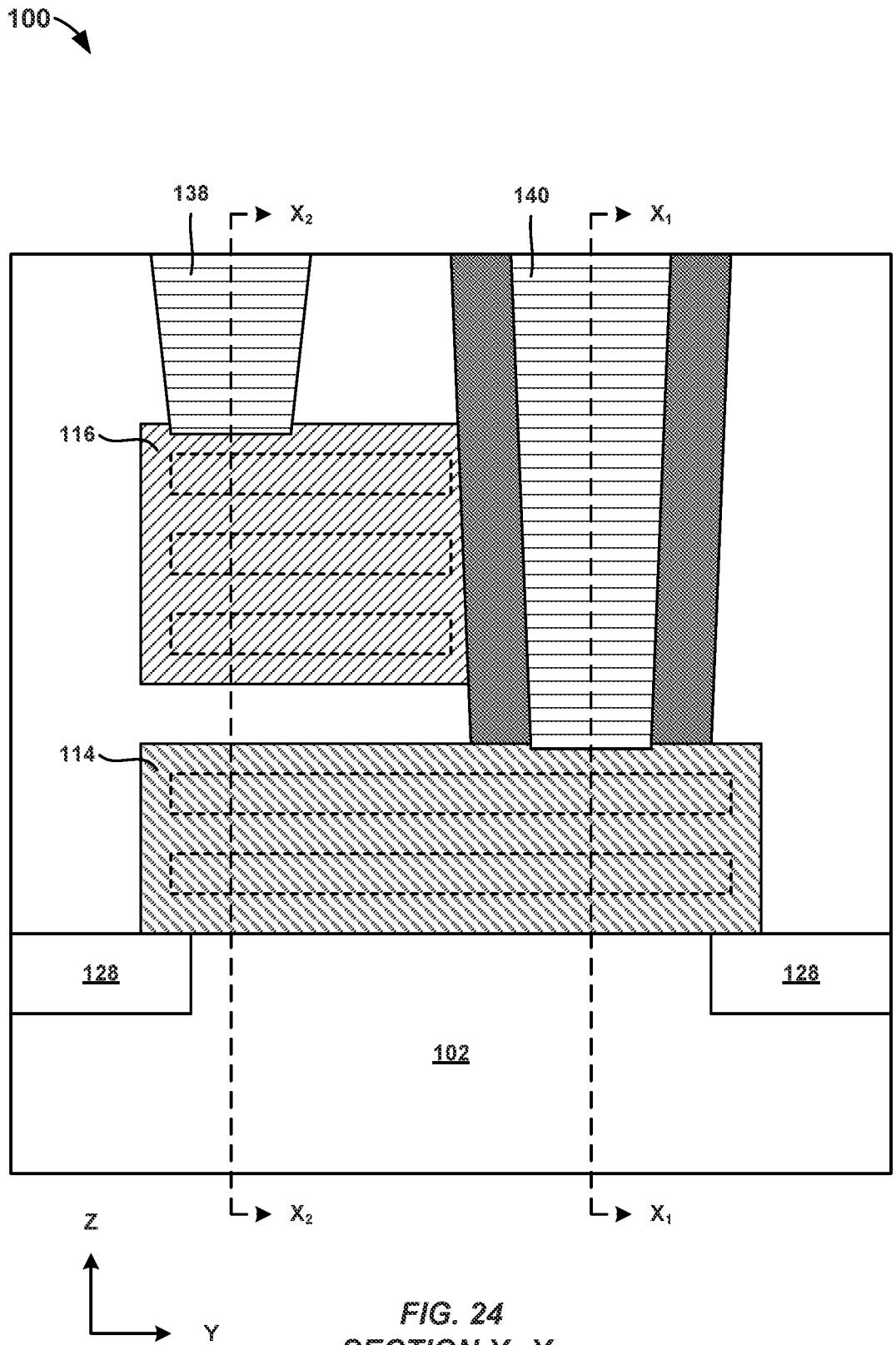
Figure 25:
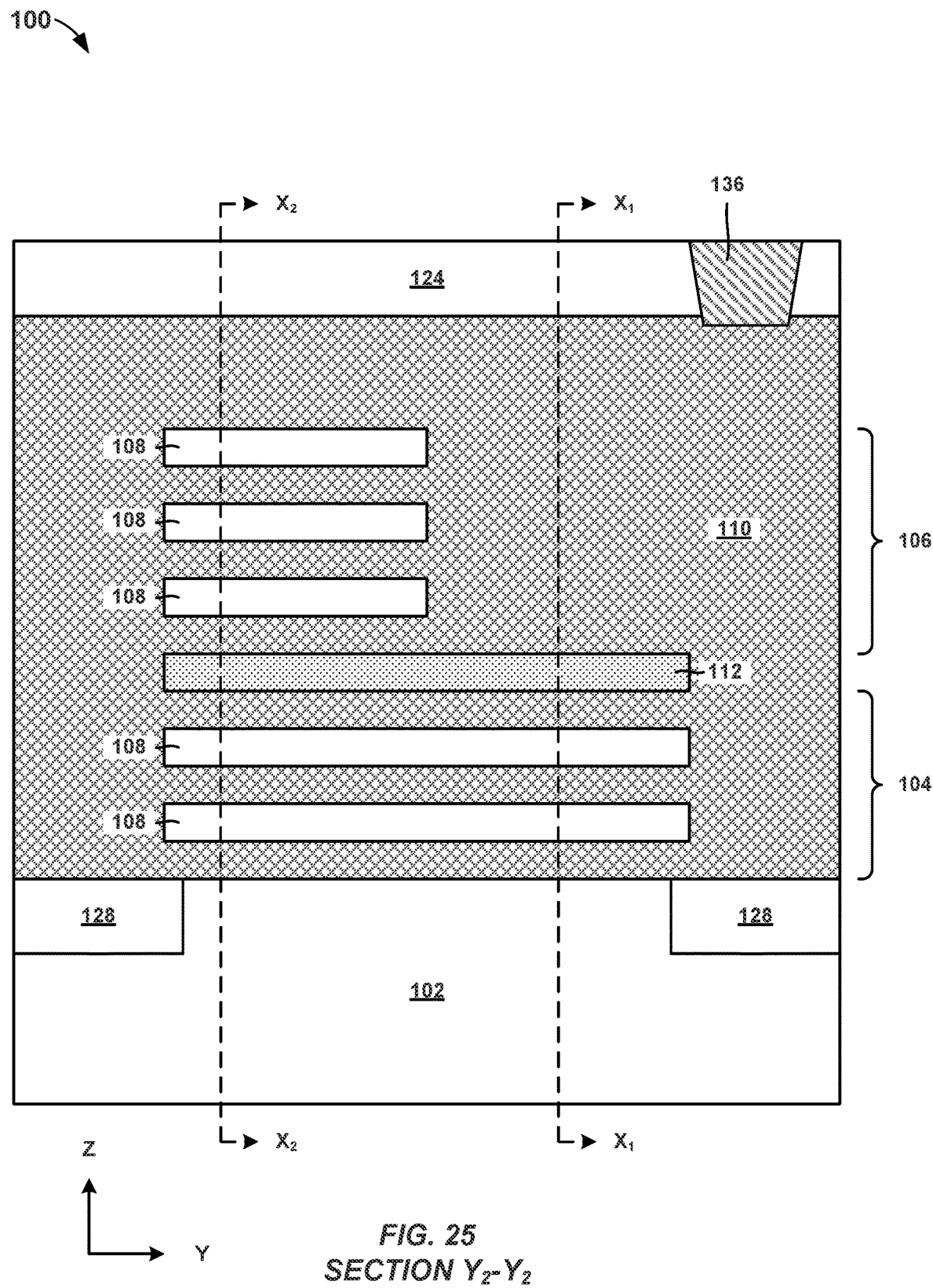

Referring now to FIGS. 21, 22, 23, 24, and 25, a structure 100 is shown after forming gate contact trenches (not shown) and top contact trenches (not shown), and subsequently filling the gate contact trenches, the top contact trenches, and the bottom contact trenches 132 with a conducive material to form gate contacts 136, top contacts 138 and bottom contacts 140 according to an embodiment of the invention. FIG. 21 is a representative illustration of a top view of the structure 100 omitting some features as described above with reference to FIG. 1. FIG. 22 depicts a cross-sectional view of the structure 100 shown in FIG. 21 taken along line $X_1$-$X_1$. FIG. 23 depicts a cross-sectional view of the structure 100 shown in FIG. 21 taken along line $X_2$-$X_2$. FIG. 24 depicts a cross-sectional view of the structure 100 shown in FIG. 21 taken along line $Y_1$-$Y_1$. FIG. 25 depicts a cross-sectional view of the structure 100 shown in FIG. 21 taken along line $Y_2$-$Y_2$.

First, the gate contact trenches and the top contact trenches are formed according to known patterning an etching techniques similar to those described above with respect to the bottom contact trenches 132. Next, the gate contact trenches, the top contact trenches, and the bottom contact trenches 132 are all filled with a conducive material to form the gate contacts 136, the top contacts 138 and the bottom contacts 140.

The contact structures (136, 138, 140) may include any suitable conductive material, such as, for example, copper, ruthenium, aluminum, tungsten, cobalt, or alloys thereof. In some embodiments, a metal silicide is formed at the bottom of the contact trenches prior to filling them with the conductive material. After, excess conductive material can be polished using known techniques until a topmost surface of the contact structures (136, 138, 140) are flush, or substantially flush, with topmost surfaces of the dielectric layer 126. It is noted, the replacement spacers 134 surround all sides of the bottom contacts 140, as illustrated in FIGS. 21, 22, and 24. Further, a length, in the x-direction, of the bottom source drain region 114 is greater than a length, in the x-direction, of the bottom contact 140. Like the bottom contact trenches 132 described above, the bottom contact 140 is also self-aligned to the replacement spacer 134, and may also be referred to as a self-aligned contact.

In sum, for purposes of this description the structure 100 illustrated in the figures and described herein includes multiple stacked transistor structures positioned adjacent, or next, to one another, and manufactured in a process flow. Embodiments of the present invention, and the detailed description provide above, are directed primarily at contact formation after a replacement metal gate is formed. Further, each stacked transistor structure includes a top device and a bottom device. More specifically, both top devices and bottom devices of each stacked transistor structure have a nanosheet, or gate-all-around, structure.

As illustrated in FIGS. 22 and 24, the stacked transistor structures represented by the structure 100 has some distinctive notable features. The bottom nanosheet stacks 104 are laterally wider, in the y-direction, than the top nanosheet stacks 106, as illustrated in FIG. 5. More specifically, the silicon channels 108 of the bottom nanosheet stacks 104 are wider, in the y-direction, than the silicon channels 108 of the top nanosheet stacks 106. As such, the corresponding source drain regions (114, 116), grown from ends of the silicon channels 108 similarly have different widths.

Unlike conventional structures, both the top gate spacers 122 and the replacement spacers 134 separate the bottom contacts 140 from the gate conductors 110. In order to make room for the additional replacement spacers 134, the top gate spacers 122 are trimmed or laterally recessed. In some embodiments this causes the gate spacers 122 to be thinner than the replacement spacers 134. Furthermore, the replacement spacers 134 are the only structure separating the top source drain regions 116 from the bottom contacts 140. As such, the replacement spacers 134 directly contact both the top source drain regions 116 and the bottom contacts 140, as illustrated in FIG. 24.

Additional distinctive notable features include the inner spacers (118) nearest to an uppermost surface of the bottom source drain region 114 includes a first top surface above a second top surface, the second top surface being substantially flush with the uppermost surface of the bottom source drain region 114. As illustrated in FIG. 24, the replacement spacer 134 directly contacts the top source drain region 116 and separates the bottom contact 140 from the top source drain region 116. Additionally, the replacement spacer 134 directly contacts a sidewall of the top source drain region 116 and an uppermost surface of the bottom source drain region 114, as illustrated in FIG. 24.

For reference purposes measurements taken in the x-direction, perpendicular to the gate conductors 110, are herein referred to as "length", while measurements taken in the y-direction, parallel to the gate conductors 110, are herein referred to as "width".

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A stacked transistor structure comprising:
   a top source drain region above a bottom source drain region, wherein a width of the bottom source drain region is greater than a width of the top source drain region;
   a bottom contact structure directly above and in electrical contact with the bottom source drain region;
   a replacement spacer surrounding the bottom contact structure; and
   a top gate spacer separating the replacement spacer from a gate conductor, wherein a sidewall of the top gate spacer directly contacts a sidewall of the replacement spacer.

2. The stacked transistor structure according to claim 1, further comprising:
   inner spacers separating the bottom source drain region from the gate conductor, wherein at least one of the inner spacers nearest to an uppermost surface of the bottom source drain region comprises a first top surface above a second top surface, the second top surface being substantially flush with the uppermost surface of the bottom source drain region.

3. The stacked transistor structure according to claim 1, wherein the replacement spacer directly contacts the top source drain region and separates the bottom contact structure from the top source drain region.

4. The stacked transistor structure according to claim 1, wherein the replacement spacer directly contacts a sidewall of the top source drain region and an uppermost surface of the bottom source drain region.

5. The stacked transistor structure according to claim 1, wherein the width of the bottom source drain region and the width of the top source drain region are measured in a direction parallel to the gate conductor.

6. The stacked transistor structure according to claim 1, wherein a length of the bottom source drain region is greater than a length of the bottom contact structure, wherein length is measured perpendicular to the gate conductor.

7. The stacked transistor structure according to claim 1, wherein the bottom contact structure is self-aligned to the replacement spacer.

8. A stacked transistor structure comprising:
a top source drain region above a bottom source drain region, wherein a width of the bottom source drain region is greater than a width of the top source drain region;
a bottom contact structure directly above and in electrical contact with the bottom source drain region;
a replacement spacer surrounding the bottom contact structure; and
a top gate spacer separating the replacement spacer from a gate conductor, wherein the replacement spacer is made from a different material than the top gate spacer, wherein a sidewall of the top gate spacer directly contacts a sidewall of the replacement spacer.

9. The stacked transistor structure according to claim 8, further comprising:
inner spacers separating the bottom source drain region from the gate conductor, wherein at least one of the inner spacers nearest to an uppermost surface of the bottom source drain region comprises a first top surface above a second top surface, the second top surface being substantially flush with the uppermost surface of the bottom source drain region.

10. The stacked transistor structure according to claim 8, wherein the replacement spacer directly contacts the top source drain region and separates the bottom contact structure from the top source drain region.

11. The stacked transistor structure according to claim 8, wherein the replacement spacer directly contacts a sidewall of the top source drain region and an uppermost surface of the bottom source drain region.

12. The stacked transistor structure according to claim 8, wherein the width of the bottom source drain region and the width of the top source drain region are measured in a direction parallel to the gate conductor.

13. The stacked transistor structure according to claim 8, wherein a length of the bottom source drain region is greater than a length of the bottom contact structure, wherein length is measured perpendicular to the gate conductor.

14. A stacked transistor structure comprising:
a top stack of nanosheet channels above a bottom stack of nanosheet channels, wherein a width of the bottom stack of nanosheet channels is greater than a width of the top stack of nanosheet channels;
a top source drain region above a bottom source drain region, wherein a width of the bottom source drain region is greater than a width of the top source drain region;
a bottom contact structure directly above and in electrical contact with the bottom source drain region;
a replacement spacer surrounding all sides of the bottom contact structure; and
a top gate spacer separating the replacement spacer from a gate conductor, wherein a sidewall of the top gate spacer directly contacts a sidewall of the replacement spacer.

15. The stacked transistor structure according to claim 14, further comprising:
inner spacers separating the bottom source drain region from the gate conductor, wherein at least one of the inner spacer nearest to an uppermost surface of the bottom source drain region comprises a first top surface above a second top surface, the second top surface being substantially flush with the uppermost surface of the bottom source drain region.

16. The stacked transistor structure according to claim 14, wherein the replacement spacer directly contacts the top source drain region and separates the bottom contact structure from the top source drain region.

17. The stacked transistor structure according to claim 14, wherein the replacement spacer directly contacts a sidewall of the top source drain region and an uppermost surface of the bottom source drain region.

18. The stacked transistor structure according to claim 14, wherein the width of the bottom source drain region and the width of the top source drain region are measured in a direction parallel to the gate conductor.

19. The stacked transistor structure according to claim 14, wherein a length of the bottom source drain region is greater than a length of the bottom contact structure, wherein length is measured perpendicular to the gate conductor.

20. The stacked transistor structure according to claim 14, wherein the top source drain region directly contacts ends of the top stack of nanosheet channels and the bottom source drain region directly contact ends of the bottom stack of nanosheet channels.

* * * * *